(12) United States Patent
Wright et al.

(10) Patent No.: US 10,524,372 B2
(45) Date of Patent: Dec. 31, 2019

(54) ENCLOSURE WITH METAL INTERIOR SURFACE LAYER

(71) Applicant: Apple Inc., Cupertino, CA (US)

(72) Inventors: James A. Wright, Sunnyvale, CA (US); Guangtao Zhang, San Francisco, CA (US); Raymund W. M. Kwok, Kowloon (HK); Karl Ruben F. Larsson, Los Altos, CA (US); Christopher S. Graham, San Francisco, CA (US); Matthew D. Hill, Santa Clara, CA (US); Abhijeet Misra, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/360,939

(22) Filed: Mar. 21, 2019

(65) Prior Publication Data

US 2019/0223310 A1 Jul. 18, 2019

Related U.S. Application Data

(63) Continuation of application No. 15/581,433, filed on Apr. 28, 2017, now Pat. No. 10,327,348, which is a
(Continued)

(51) Int. Cl.
*H05K 5/04* (2006.01)
*H02J 50/10* (2016.01)
(Continued)

(52) U.S. Cl.
CPC ............ *H05K 5/04* (2013.01); *G06F 1/1656* (2013.01); *G06F 1/1658* (2013.01); *G06F 1/182* (2013.01);
(Continued)

(58) Field of Classification Search
CPC .......... H05K 5/04; H05K 7/1427; H05K 5/03; H02J 50/10; H01Q 7/00; H01Q 1/38; H04M 1/0202
(Continued)

(56) References Cited

U.S. PATENT DOCUMENTS 6,058,293 A * 5/2000 Phillips ............... H04M 1/0202
455/575.1
7,449,100 B2 11/2008 Yoshimura et al.
(Continued)

FOREIGN PATENT DOCUMENTS

CN 1500157 5/2004
CN 101235500 8/2008
(Continued)

OTHER PUBLICATIONS

Welding of Coated Steels, Total Materia Article, http://www.totalmateria.com/page.aspx?ID_CheckArticle&site=kts&NM=191, published Dec. 2006, 3 pages.
(Continued)

*Primary Examiner* — Andargie M Aychillhum
*Assistant Examiner* — Michael F McAllister
(74) *Attorney, Agent, or Firm* — Brownstein Hyatt Farber Schreck, LLP

(57) ABSTRACT

An enclosure is formed by coupling an outer cover to a back enclosure piece. The enclosure defines an interior volume for receiving components of an electronic device. The back enclosure piece is formed from a metal frame component and a non-metal outer cover. A metal layer overlaps the metal frame component and the outer cover within the interior volume. The metal layer has a thickness that provides support and shatter resistance to the non-metal outer cover. The metal layer can form an inductor of a wireless power transfer circuit.

20 Claims, 29 Drawing Sheets

Related U.S. Application Data continuation of application No. 15/389,852, filed on Dec. 23, 2016, now abandoned.

(60) Provisional application No. 62/387,196, filed on Dec. 23, 2015.

(51) Int. Cl.
  *H01Q 1/38* (2006.01)
  *H01Q 7/00* (2006.01)
  *H05K 5/03* (2006.01)
  *G06F 1/18* (2006.01)
  *H04M 1/02* (2006.01)
  *H05K 7/14* (2006.01)
  *G06F 1/16* (2006.01)

(52) U.S. Cl.
  CPC ............... *H01Q 1/38* (2013.01); *H01Q 7/00* (2013.01); *H02J 50/10* (2016.02); *H04M 1/0202* (2013.01); *H05K 5/03* (2013.01); *H05K 7/1427* (2013.01)

(58) Field of Classification Search
  USPC .......................................................... 174/250
  See application file for complete search history.

(56) References Cited

U.S. PATENT DOCUMENTS

| | | | |
|---|---|---|---|
| 7,473,864 B2 | 1/2009 | Iwase et al. | |
| 7,710,728 B2 | 5/2010 | Arisaka et al. | |
| 7,800,011 B2 | 9/2010 | Fukuda et al. | |
| 7,874,473 B2 | 1/2011 | Erlangen et al. | |
| 8,191,231 B2 | 6/2012 | Lo et al. | |
| 8,242,378 B2 | 8/2012 | Amin et al. | |
| 8,502,105 B2 | 8/2013 | Tanaka et al. | |
| 8,507,825 B2 | 8/2013 | Miyamoto et al. | |
| 9,241,435 B2 | 1/2016 | Ho et al. | |
| 9,668,859 B2 | 1/2017 | Au et al. | |
| 9,607,914 B2 | 3/2017 | Gwin | |
| 9,699,926 B2 | 7/2017 | Hwang et al. | |
| 9,819,076 B2* | 11/2017 | Koo | H01Q 1/38 |
| 2004/0099716 A1 | 5/2004 | Yuan et al. | |
| 2004/0227679 A1* | 11/2004 | Lu | H01Q 1/243 343/702 |
| 2007/0216580 A1* | 9/2007 | Lin | H01Q 1/243 343/702 |
| 2009/0189827 A1* | 7/2009 | Yang | H01Q 1/243 343/872 |
| 2010/0156750 A1* | 6/2010 | Ishibashi | H01Q 1/40 343/873 |
| 2010/0203924 A1 | 8/2010 | Hirota | |
| 2011/0064870 A1 | 3/2011 | Li et al. | |
| 2011/0186347 A1* | 8/2011 | Zhang | B29C 43/021 174/546 |
| 2011/0250400 A1* | 10/2011 | Lee | B29C 45/0053 428/161 |
| 2012/0042505 A1* | 2/2012 | Lo | H01Q 1/243 29/600 |
| 2014/0243911 A1 | 8/2014 | Almarza et al. | |
| 2014/0246323 A1 | 9/2014 | Porter et al. | |
| 2014/0268525 A1* | 9/2014 | Hwang | B29C 45/0053 361/679.01 |
| 2015/0237724 A1* | 8/2015 | Au | H01B 1/02 428/651 |
| 2015/0352658 A1 | 12/2015 | Yang et al. | |
| 2016/0149294 A1* | 5/2016 | Koo | H01Q 1/38 205/125 |
| 2016/0227655 A1 | 8/2016 | Han et al. | |
| 2016/0268178 A1* | 9/2016 | Gwin | H01L 23/04 |
| 2018/0084653 A1 | 3/2018 | Misra et al. | |
| 2018/0103557 A1 | 4/2018 | Wright et al. | |

FOREIGN PATENT DOCUMENTS

| | | |
|---|---|---|
| CN | 101536063 | 9/2009 |
| CN | 101994105 | 3/2011 |
| CN | 103095866 | 5/2013 |
| CN | 204733194 | 10/2015 |

OTHER PUBLICATIONS

Welding of Dissimilar Metals, Total Materia Article, http://www.totalmateria.com/page.aspx?ID-CheckArticle&site=ktn&NM=152, 4 pages.
U.S. Appl. No. 15/389,852, filed Dec. 23, 2016, Wright et al.

* cited by examiner

ENCLOSURE WITH METAL INTERIOR SURFACE LAYER

CROSS-REFERENCE TO RELATED APPLICATION

This application is a continuation of U.S. patent application Ser. No. 15/581,433, filed Apr. 28, 2017, and titled "Enclosure with Metal Interior Surface Layer," which is a continuation of U.S. patent application Ser. No. 15/389,852, filed Dec. 23, 2016, and titled "Enclosure with Metal Interior Surface Layer," now abandoned, which is a non-provisional patent application of, and claims the benefit of, U.S. Provisional Patent Application No. 62/387,196, filed Dec. 23, 2015, and titled "Enclosure With Metal Interior Surface Layer," the disclosures of which are hereby incorporated herein by reference in their entirety.

FIELD

Embodiments described herein generally relate to electronic device enclosures, and, more particularly, to systems and methods for depositing structural layers of metal onto interior surfaces of electronic device enclosures.

BACKGROUND

An electronic device can be accommodated in an enclosure that supports and protects its operational components. The enclosure can be formed from multiple pieces, some of which may be made from resilient materials and some of which may be made from frangible materials. For example, an enclosure can be formed by fastening a metal enclosure piece to a glass or acrylic enclosure piece.

However, frangible pieces of an enclosure can fragment or shatter on impact, which may inhibit comfortable operation of the electronic device, or may expose the operational components of the electronic device to unintended environments.

SUMMARY

Embodiments described herein generally reference an electronic device. The electronic device includes an enclosure that includes a front enclosure piece (e.g., a cover glass) and a back enclosure piece. The back enclosure piece is formed from a frame component that may be formed from metal and an outer cover that may be formed from glass. The frame component of the back enclosure piece defines an outer perimeter or sidewall of the enclosure and the outer cover defines a back surface of the enclosure. The frame component and the outer cover can be bonded to one another by a metal layer formed onto interior surfaces of each component so as to overlap the interface between the components. In this manner, the metal layer provides structural support to the enclosure along the interface between the outer cover and the frame component.

In other cases, the metal layer can be formed onto only a portion of the outer cover. In these examples, the metal layer can define circuit traces, inductive coils for wireless power transfer, antennas, antenna ground planes, heat sinks, heat spreaders, and so on.

In many embodiments, the metal layer can be disposed using a combination of electroless plating and electroplating techniques. In particular, a polymer primer layer can be disposed on the interior surface of the outer cover and a separate primer layer can be disposed on the interior surface of the frame component. The primer layers can be activated with a metal such as palladium, and can be electrolessly plated to form an electroless metal layer. The primer layers strongly bond the electroless metal layer to the outer cover. Once the electroless metal layer is formed, an electroplating process can be used to form an electroplated metal layer that overlaps the interface between the frame component and the outer cover. The electroplated metal layer can be any suitable thickness. The metal layer can, without limitation: provide anti-splinter protection to the outer cover, provide a strong mechanical bond between the non-metal material of the outer cover and the metal material of the frame, provide a circuit path across the outer cover and/or the frame component, serve as a heat spreader or heat sink, define an inductive coil for wireless power transfer, and so on.

BRIEF DESCRIPTION OF THE DRAWINGS

Reference will now be made to representative embodiments illustrated in the accompanying figures. It should be understood that the following descriptions are not intended to limit this disclosure to one preferred embodiment. To the contrary, it is intended to cover alternatives, modifications, and equivalents as may be included within the spirit and scope of the described embodiments as defined by the appended claims.

The use of the same or similar reference numerals in different figures indicates similar, related, or identical items.

Figure 1:
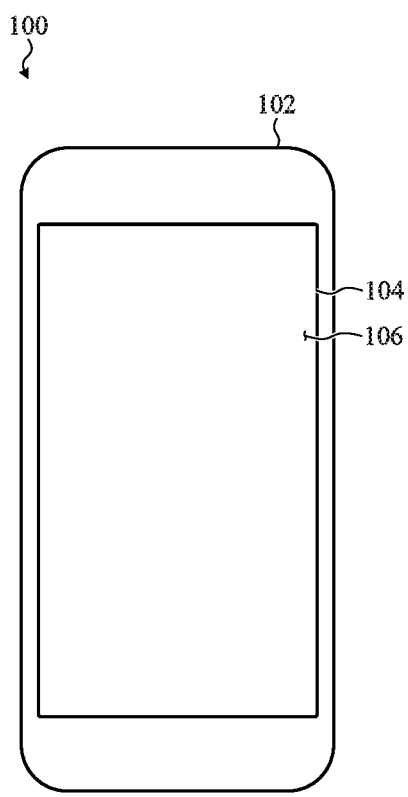
FIG. 1 depicts an electronic device enclosure.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Representative embodiments illustrated in the accompanying drawings are disclosed and described in greater detail below, although the following descriptions are not intended to suggest limitation of the disclosure to a bounded set of preferred embodiments. Rather, it may be understood that alternatives, modifications, and equivalents of the described and illustrated embodiments are possible.

In particular, embodiments described herein generally reference an enclosure for an electronic device having an interior surface coated, at least partially, with a layer of metal. As used herein, the phrase "interior surface" generally refers to a surface that at least partially defines an internal volume of an enclosure. For example, many enclosures have the shape of a hollow and shallow rectangular prism. Such an enclosure has an interior surface with six sides; four sidewalls define a perimeter of the interior surface and two endcaps define a top and bottom of the interior surface. In addition, the four sidewalls define an interior height of the enclosure.

In many embodiments, the metal layer is disposed over at least two portions of the interior surface of the enclosure. For example, the metal layer may be disposed over at least two sidewalls of the interior volume and/or over the bottom surface of the interior volume. In this manner, the metal layer can provide structural or functional benefits to the enclosure or the associated electronic device including, but not limited to: anti-shatter support for a frangible portion of the enclosure; providing anti-splinter properties for a frangible portion of the enclosure; structural support for a portion of the enclosure; an electrical circuit path; a thermal path; an electromagnetic shielding for one or more electrical components; serving as an antenna or a portion of an antenna; an electromagnetic coil or a portion of an electromagnetic coil, serving as an electrical sensor; and so on. In many cases, the metal layer may serve more than one of the purposes described herein.

These and other embodiments are discussed below with reference to FIGS. 1-11. However, those skilled in the art will appreciate that the detailed description given herein with respect to these figures is for explanation only and should not be construed as limiting.

FIG. 1 depicts an electronic device 100 disposed within an enclosure 102. The enclosure 102 defines an interior volume that retains, supports, and/or encloses various components of the electronic device 100, such as a display 104. The display 104 can be implemented in any suitable manner. For example, the display 104 may include a stack of multiple layers including, in no particular order: an organic light emitting diode layer; a cover layer; a touch input layer; a force input layer; a biometric authentication layer; and so on. Other embodiments can implement the display 104 in a different manner, such as with: liquid crystal display technology; light emitting diode display technology; electronic ink technology; quantum dot technology; and so on. In many embodiments, a protective outer layer of the display 104 defines an input surface 106.

The enclosure 102 can be made from any suitable material or material type such as, but not limited to metal, plastic, ceramic, glass, sapphire, acrylic, and so on or combinations thereof. The enclosure 102, in some embodiments, may be a multi-purpose component serving an additional function such as, but not limited to: an environmental and/or hermetic seal for one or more components of the display 104 or the electronic device 100; pressure relief for one or more components of the display 104 or the electronic device 100; providing or otherwise defining gaps between one or more layers of the display 104 for thermal venting and/or to permit flexing of the layers in response to a force applied to the input surface 106; and so on.

The electronic device 100 can also include a processor, memory, power supply and/or battery, network connections, sensors, input/output ports, acoustic elements, haptic elements, digital and/or analog circuits for performing and/or coordinating tasks of the electronic device 100, and so on. In many cases, these and other components may be disposed on a circuit board referred to as a main logic board. For simplicity of illustration, the electronic device 100 is depicted in FIG. 1 without many of these elements, each of which may be included, partially and/or entirely, within the enclosure 102.

Furthermore, although illustrated as a cellular phone, the electronic device 100 can be another electronic device that is either stationary or portable, taking a larger or smaller form factor than illustrated. For example, in certain embodiments, the electronic device 100 can be a laptop computer, a tablet computer, a cellular phone, a wearable device such as a watch or a display, a health monitoring device, a home or building automation device, a home or building appliance, a craft or vehicle entertainment console, control, and/or information system, a navigation device, input device (e.g., keyboard, trackpad, mouse), and so on.

Generally and broadly, FIGS. 2A-2M depict various portions of the enclosure 102 of the electronic device 100 shown in FIG. 1. The enclosure is identified in these figures as the enclosure 200.

Figure 2A:
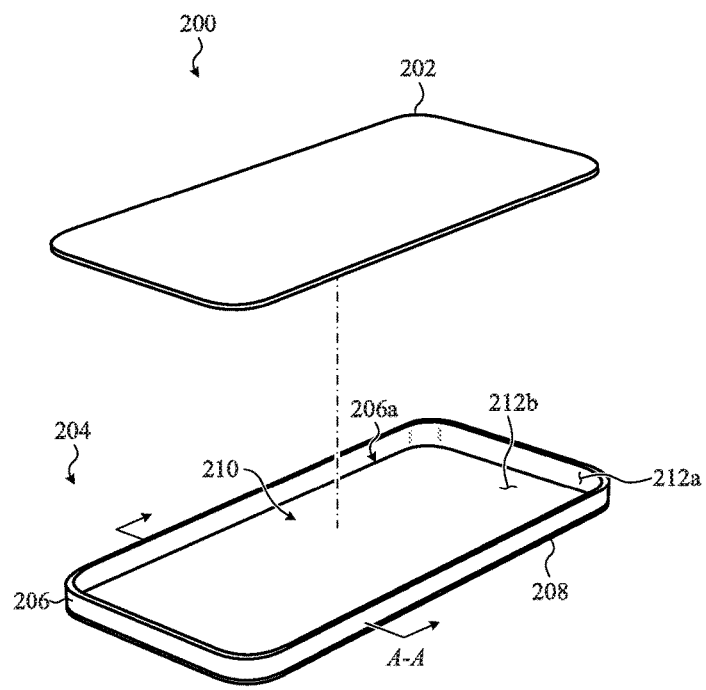
FIG. 2A depicts an exploded, simplified, view of the enclosure of FIG. 1, specifically showing a front enclosure piece positioned over a back enclosure piece.

The enclosure 200 is formed from multiple pieces affixed to one another. For example, the enclosure can include a front enclosure piece 202 and a back enclosure piece 204, such as shown in FIG. 2A. The back enclosure piece 204 takes the general shape of a shallow, open-faced container with a raised rim circumscribing the perimeter of a substantially planar base. In an assembled configuration, the front enclosure piece 202 is affixed to an open face of the back enclosure piece 204 (e.g., a bucket-and-lid configuration). Other configurations and/or pieces may be used to form the enclosure 200 in various embodiments. As one example, the back enclosure piece 204 may form an upper portion of an electronic device. Likewise, the front enclosure piece 202 may extend to form one or more sidewalls of the electronic device.

The back enclosure piece 204 can be a unitary piece (e.g., formed from a single material), or may be a multi-part piece. For example, the back enclosure piece 204 as illustrated includes a frame component 206 and an outer cover 208. The frame component 206 of the back enclosure piece 204 defines the raised rim of the back enclosure piece 204. The outer cover 208 defines the flat/planar base of the back enclosure piece 204. In this manner, the frame component 206 and the outer cover 208 define an internal volume 210 of the back enclosure piece 204. The internal volume includes four sidewalls defined by the frame component 206 and a bottom defined by the outer cover 208. When in an assembled configuration, the front enclosure piece 202 is positioned over the frame component 206 of the back enclosure piece 204 so as to enclose and/or seal the internal volume 210. In this manner, the front enclosure piece 202, outer sidewalls of the frame component 206, and the outer cover 208 cooperate to define the outer surface of the enclosure 200. More particularly, the front enclosure piece 202 defines a first portion of the outer surface of the enclosure 202, the frame component 206 defines a second portion of the outer surface of the enclosure 202, and the outer cover 208 defines a third portion of the outer surface of the enclosure 202.

In many cases, the front enclosure piece 202 is a glass layer or cover glass that is configured to protect a display or input device or sensor disposed within the enclosure 200.

In the illustrated embodiment, a metal layer 212 is disposed over the four sidewalls and bottom of the internal volume 210. More specifically, the metal layer 212 overlaps the sidewalls and the bottom of the internal volume 210 and is bonded to both the frame component 206 and the outer cover 208. The portion of the metal layer 212 bonded to the frame component 206 is labeled as the metal layer portion 212a and the portion of the metal layer 212 bonded to the outer cover 208 is labeled as the metal layer portion 212b. Collectively, the metal layer portions 212a, 212b are referred to herein as the metal layer 212.

In many examples, the frame component 206 and the outer cover 208 are affixed to one another using, for example and without limitation: a pressure sensitive adhesive; a curable liquid adhesive; a mechanical fastener; or any other suitable material and/or any combination thereof.

The frame component 206 can be formed from any suitable metal or non-metal material including, but not limited to, metals such as aluminum, stainless steel, gold, rose gold, platinum, titanium, amorphous metal alloys, and so on; non-metals such as plastic, wood, leather, nylon, polymeric materials, plastics, ceramics, glass, and so on. In some examples, the frame component 206 is formed by bonding multiple elements to one another whereas in other examples, the frame component 206 has a unitary construction. In some embodiments, the frame component 206 may not be required.

Similarly, the outer cover 208 can be formed from any suitable metal or non-metal material including but not limited to metals such as aluminum, stainless steel, gold, rose gold, platinum, titanium, amorphous metal alloys, and so on; non-metals such as plastic, wood, leather, nylon, polymeric materials, plastics, ceramics, glass, and so on. In some examples, the outer cover 208 is formed by bonding multiple elements to one another whereas in other examples, the outer cover 208 has a unitary construction. In a typical embodiment, the outer cover 208 is formed from one or more layers of strengthened or hardened glass. In these cases and other embodiments, the outer cover 208 can be referred to as a glass layer.

The metal layer 212 can be formed as a uniform or a multi-layer material. In one example, the metal layer 212 is partially or entirely copper. In another example, the metal layer 212 is formed from a cobalt-nickel alloy. In still further examples, the metal layer 212 is formed from layers of different metals such as, but not limited to: cadmium; chromium; copper; gold; lead; nickel; platinum; silver; tin; zinc; cobalt-nickel; alloys of metal; and so on or any combination thereof. The various layers of the metal layer 212 may each have different thickness. In some cases, the layers may be formed to take different shapes; a copper layer may take one shape whereas a silver layer takes another shape.

In one embodiment, the frame component 206 is formed from metal and the outer cover 208 is formed from a non-metal material, such as glass, sapphire, or acrylic. FIGS. 2B-2H present various detail views of such an embodiment.

Figure 2B:
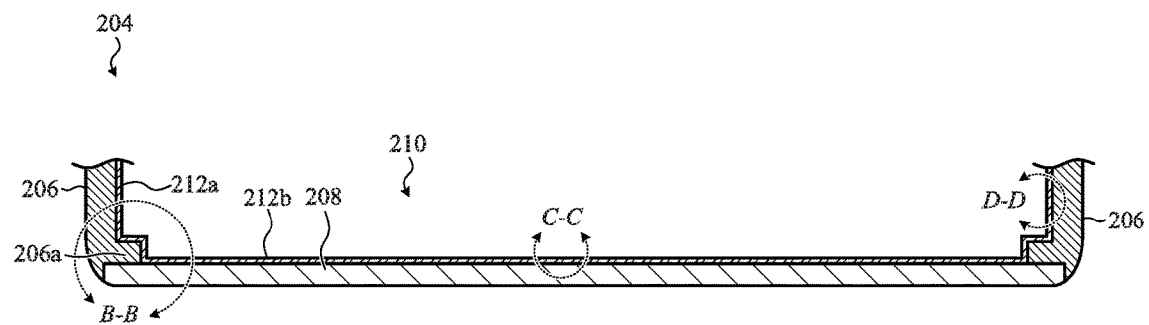
FIG. 2B depicts a cross-section view of the back enclosure piece of FIG. 2A, taken along section line A-A, specifically showing a metal layer disposed on an interior surface of the back enclosure piece (the "metal layer").
Figure 2C:
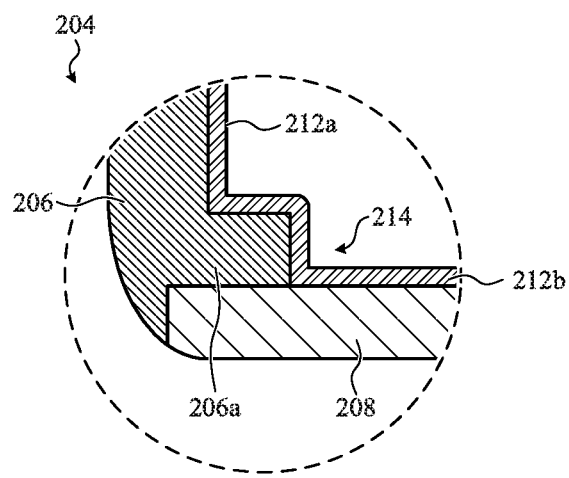
FIG. 2C depicts a detail view of the enclosed circle B-B of the back enclosure piece cross-section depicted in FIG. 2B, specifically showing the metal layer overlapping two components of the back enclosure piece, particularly a frame component and an outer cover.

Specifically, FIG. 2B depicts a cross-section view of the back enclosure piece 204 of FIG. 2A, taken along section line A-A, specifically showing the metal layer portions 212a, 212b disposed on the interior surface of the back enclosure piece 204. As shown, the metal layer 212 overlaps the frame component 206 and the outer cover 208, thereby increasing the strength of the bond between those components. More specifically, FIG. 2C depicts a detail view of the enclosed circle B-B of the back enclosure piece 204, specifically showing the metal layer portions 212a, 212b overlapping the interface between the frame component 206 and the outer cover 208.

In one example, the frame component 206 defines a shelf 206a. The outer cover 208 is adhered to the shelf 206a. The shelf 206a may extend from the sidewall(s) of the frame component 206 in order to provide additional structural support for the outer cover 208. The metal layer 212 is disposed over the shelf 206a such that a portion of the metal layer 212a is disposed over the frame component 206 and a portion of the metal layer 212b is disposed over the outer cover 208. More specifically, the metal layer 212 overlaps an interface 214 at which the frame component 206 and the outer cover 208 meet.

Figure 2D:
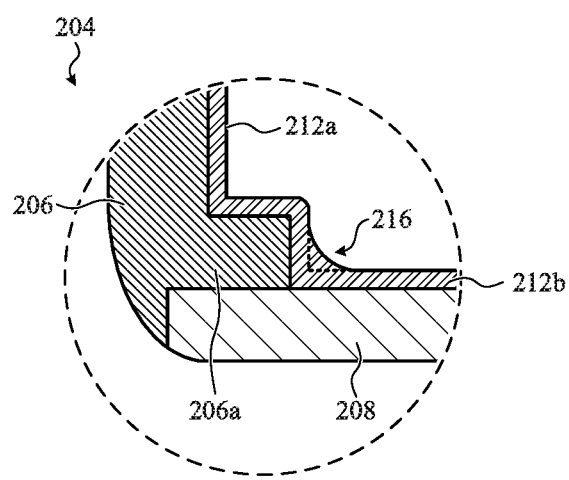
FIG. 2D depicts the detail view of FIG. 2C additionally depicting a structural fillet formed at an interface between the frame component and the outer cover of the back enclosure piece.

In some embodiments, such as shown in FIG. 2D, the interface 214 may be strengthened by forming or otherwise adding a fillet 216. The fillet 216 can be formed from the same material and/or at the same time as the metal layer 212, although this may not be required. In some examples, the fillet 216 is formed using the same process used to form the metal layer 212, although this may not be required or performed in all embodiments. The fillet 216 typically has a thickness greater than that of an average thickness of the metal layer 212.

Figure 2E:
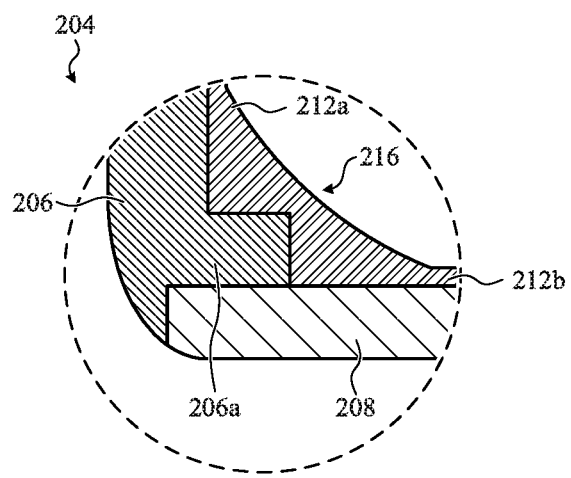
FIG. 2E depicts the detail view of FIG. 2C additionally depicting another structural fillet formed at an interface between the frame component of the back enclosure piece and the outer cover of the back enclosure piece, particularly overlapping a shelf portion of the frame component.
Figure 2F:
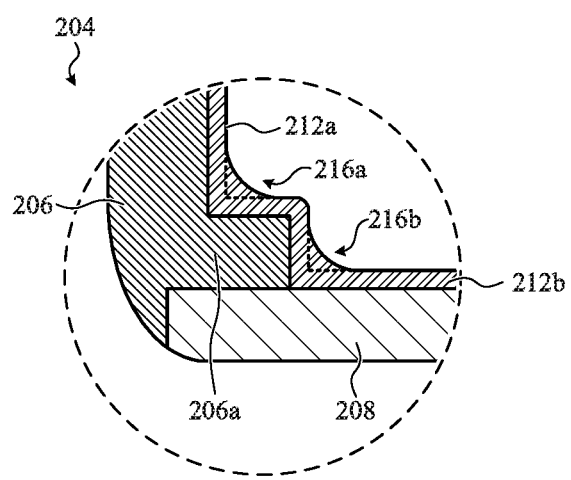
FIG. 2F depicts the detail view of FIG. 2C additionally depicting a pair of structural fillets formed at an interface between the frame component of the back enclosure piece and the outer cover of the back enclosure piece.

In other cases, a fillet 216 may overlap the shelf 206a, such as depicted in FIG. 2E. In other cases, more than one fillet 216 can be formed, such as shown in FIG. 2F. In this embodiment, a first fillet 216a is formed on the shelf 206a and a second fillet 216b is formed at the interface at which the frame component 206 and the outer cover 208 meet.

As noted with respect to other embodiments described herein, the metal layer 212 can take any suitable thickness at any location. For example, in some embodiments, the metal layer 212 has a thickness of 90-120 micrometers, while in others the metal layer 212 may be approximately 100 micrometers. In other embodiments, the metal layer 212 may have a greater thickness or may be thinner than the example ranges provided herein. The thickness of the metal layer 212 may be selected at least in part based on the material(s) selected for the frame component 206 and the material(s) selected for the outer cover 208. For example, the metal layer 212 may have a greater thickness in embodiments in which the outer cover 208 is formed from a frangible material. The greater thickness of the metal layer 212 may provide anti-shatter support/protection to the frangible material; the metal layer 212 is operative to retain fragments of the frangible material if the frangible material cracks. In these embodiments the metal layer 212 may have a substantially uniform thickness.

As may be appreciated, the metal layer 212 may not bond in the same manner to the non-metal material of the outer cover 208 as to the metal material of the frame component 206. Accordingly, many embodiments described herein may utilize a primer layer (or, more generally, an inter-bonding adhesion promoter layer) disposed over the various components of the back enclosure piece 204. The primer layer applied to the outer cover 208 is typically a different primer layer than is applied over the frame component 206, but this may not be required.

Figure 2G:
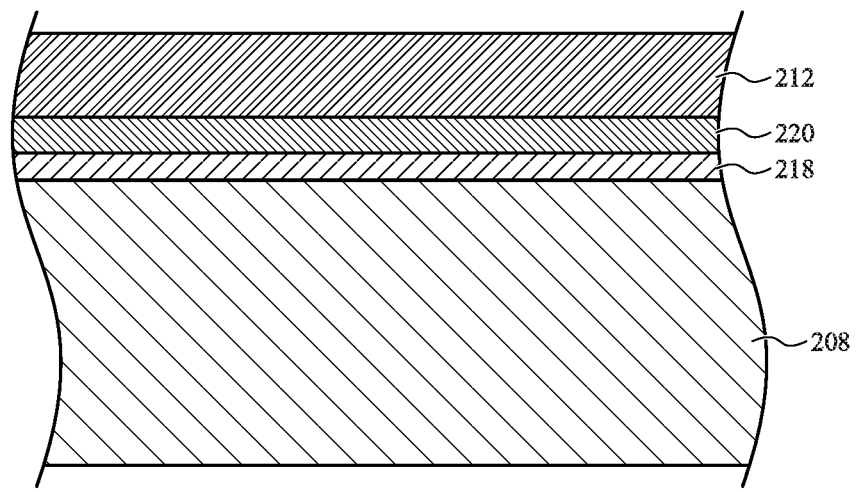
FIG. 2G depicts a detail view of the enclosed circle C-C of the back enclosure piece cross-section depicted in FIG. 2B, specifically showing a primer layer and a cathode layer disposed between the non-metal portion of the back enclosure piece and the metal layer.
Figure 2H:
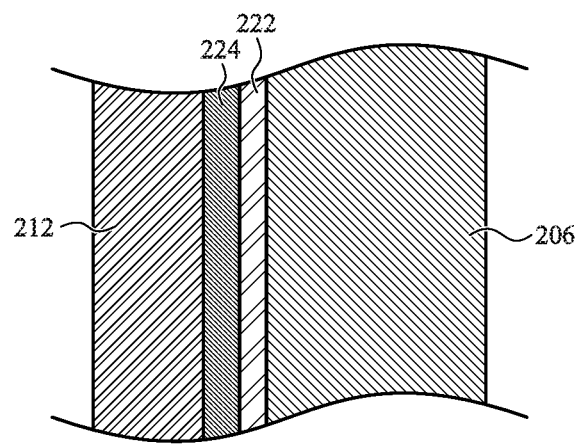
FIG. 2H depicts a detail view of the enclosed circle D-D of the back enclosure piece cross-section depicted in FIG. 2B, specifically showing a primer layer and a cathode layer disposed between the metal portion of the back enclosure piece and the metal layer.
Figure 2I:
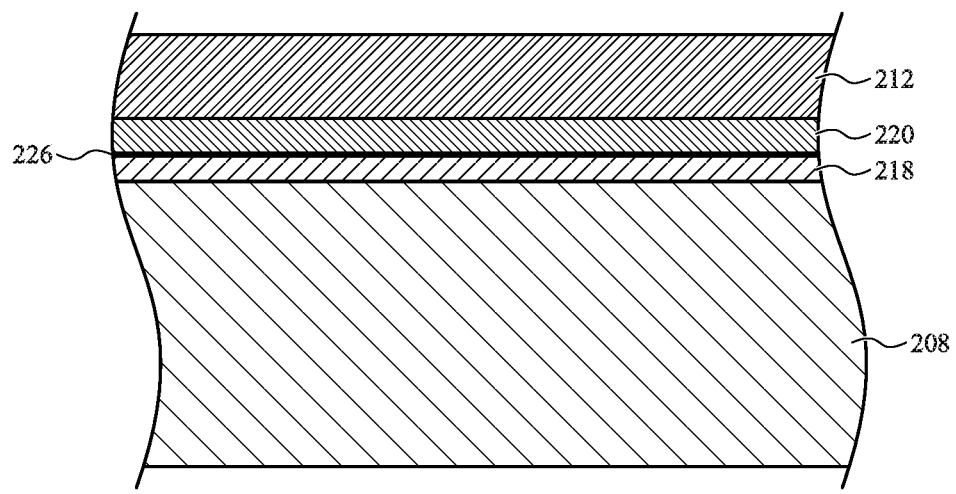
FIG. 2I depicts a detail view of FIG. 2G, specifically showing an activation layer applied to the primer layer.
Figure 2J:
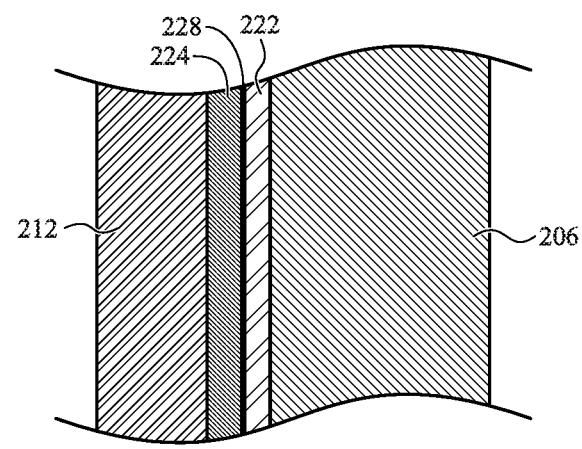
FIG. 2J depicts a detail view of FIG. 2H, specifically showing an activation layer applied to the primer layer.

Particularly, FIG. 2G depicts a detail view of the enclosed circle C-C of the back enclosure piece 204, specifically showing a primer layer 218 disposed between the non-metal material of the outer cover 208 and the metal layer 212.

The primer layer 218 can be formed from any number of suitable materials or combination of materials. In many embodiments, the primer layer 218 is formed from a material selected for that material's ability to bond to the glass selected for the outer cover 208. In one example, the primer layer 218 is a polymer-based adhesive.

In some cases, the primer layer 218 can be disposed over the entire interior surface of the outer cover 208 whereas in other cases the primer layer 218 is disposed over only a portion of the interior surface of the outer cover 208. In such an embodiment, the primer layer 218 can be formed in a particular pattern.

In many cases, the outer cover 208 may undergo a preparation operation prior to application of the primer layer 218. The preparation operation defines one or more prepared regions of the outer cover 208. The one or more prepared regions can be referred to as "prepared surfaces" of the outer cover 208.

The preparation operation can include, but is not limited to: cleaning one or more surfaces of the outer cover 208; rinsing one or more surfaces of the outer cover 208; polishing one or more surfaces of the outer cover 208; chemical strengthening of one or more surfaces of the outer cover 208; roughening one or more surfaces of the outer cover 208; and/or any other suitable preparation operation or combination or series of preparation operations. For simplicity of description, the embodiments that follow generally refer to a prepared surface as a "roughened surface" or a surface that has been roughened, but, as noted above, this operation may not be required.

In one non-limiting example, one or more surfaces of the outer cover 208 can be roughened prior to applying the primer layer 218. Roughening of these surfaces promotes adhesion between the primer layer 218 and the material of the outer cover 208. In a typical example, an interior surface of the outer cover 208 is roughened while an exterior surface of the outer cover 208 is either polished or not roughened.

Roughening of the interior surface(s) of the outer cover 208 may be accomplished in any suitable manner such as, but not limited to: laser ablation; chemical etching; particle blasting; mechanical abrasion; and so on. In some examples, more than one operation may be performed to achieve a desired roughening of the outer cover 208. In some embodiments, the outer cover 208 is roughened prior to a chemical strengthening process in order to avoid disruptions to the compressive residual stress distribution at the surface of the outer cover 208. In still further embodiments, roughening of the interior surface(s) of the outer cover 208 can introduce nanoscale features (such as recesses, undercuts, peaks, valleys, and so on) that promote bonding and/or adhesion between the primer layer 218 and the outer cover 208. In other cases, microscale roughening or macroscale roughening may be suitable. In some embodiments, a roughening operation, and/or one or more parameters of a roughening operation, can be selected to confer particular optical properties to the outer cover 208. For example, if the outer cover 208 is formed from an optically clear material (e.g., glass, sapphire, and so on), the outer cover 208 can be roughened so as to cause the outer cover 208 to appear translucent or opaque.

In certain cases, the outer cover 208 is roughened or prepared in a pattern, although this may not be required. In other cases, the outer cover 208 can be roughened differently in different regions. For example, a perimeter region or a sidewall of the outer cover 208 can be roughened using a different process than a planar surface of the outer cover 208. In other cases, different regions of a planar surface of the outer cover 208 can be roughened differently (e.g., using different processes, using the same process differently, and so on).

The primer layer 218 may include a pigment or ink. The pigment may render the outer cover 208 opaque. The pigment may be mixed in with the primer layer 218 or may be applied to the outer cover 208 prior to applying the primer layer 218. In other cases, the primer layer 218 may be selected for its inherent color, reflectivity, translucency, or transparency; adding a pigment or ink may not be required.

In some cases, the pigment can be applied uniformly throughout the primer layer 218. In these examples, the primer layer 218 has a consistent and uniform color. In other cases, the pigment can be applied in a non-uniform manner to define a symbol, letter, pattern, or texture. In these examples, if the outer cover 208 is made from an optically transparent material, the pigment of the primer layer 218 can provide a color (or other optical property) to the outer cover 208.

In some cases, the pigment can be applied in certain regions of the primer layer 218. For example, pigment may be omitted in one region and included in another region of the primer layer 218. In certain cases, pigment can be omitted in a certain region so as to define an optically clear path through the outer cover 208 at that region (e.g., optical window, optical aperture, marketing or labeling information window, and so on). In some cases, the pigment can be applied or activated in the primer layer 218 to define a reflection pattern (e.g., mirror finish, infrared bar code or serial number, and so on) or another optical pattern (e.g., picture, text, and so on).

In certain embodiments, a cathode layer 220 is disposed and/or formed over the primer layer 218. The cathode layer 220 is typically disposed by an electroless plating technique, although other means of disposing and/or forming the cathode layer onto the primer layer 218 may be used. As such, the cathode layer 220 can be referred to as an electroless metal layer. Thereafter, the metal layer 212 may be formed over the cathode layer 220 using an electroplating technique. As such, the metal layer 212 can be referred to as an electroplated metal layer.

In some examples, the cathode layer 220 is 1.0 micrometer thick. In other embodiments, the cathode layer 220 can have a different thickness. In one non-limiting example, the cathode layer 220 is formed from electroless nickel.

The metal layer 212 can be applied to the metal material of the frame component 206 in a similar manner. Particularly, and with reference to FIG. 2H, (depicting a detail view of the enclosed circle D-D of the back enclosure piece 204) a primer layer 222 and a cathode layer 224 can be disposed between the frame component 206 of the back enclosure piece 204.

The primer layer 222 can be formed from any number of suitable materials or combinations of materials. In many embodiments, the primer layer 222 is formed from a material selected for that material's ability to bond to the material selected for the frame component 206. As one example, the primer layer 222 is partially or fully formed from zincate.

In some cases, the primer layer 222 can be disposed over the entire interior surface of the frame component 206 whereas in other cases the primer layer 222 is disposed over only a portion of the interior surface of the frame component 206. In such an embodiment, the primer layer 222 can be formed in a particular pattern.

In many cases, the frame component 206 may undergo a preparation operation prior to application of the primer layer 222. The preparation operation can include, but is not limited to: cleaning one or more surfaces of the frame component 206; rinsing one or more surfaces of the frame component 206; polishing one or more surfaces of the frame component 206; chemical strengthening of one or more surfaces of the frame component 206; roughening one or more surfaces of the frame component 206; and/or any other suitable preparation operation.

In one non-limiting example, one or more surfaces of the frame component 206 are roughened or otherwise prepared prior to applying the primer layer 222. Roughening of these surfaces promotes adhesion between the primer layer 222 and the material of the frame component 206. In a typical example, an interior surface of the frame component 206 is roughened while an exterior surface of the frame component 206 is either polished or not roughened.

Roughening of the interior surface(s) of the frame component 206 may be accomplished in any suitable manner such as, but not limited to: laser ablation; chemical etching; particle blasting; mechanical abrasion; and so on. In some examples, more than one operation may be performed to achieve a desired roughening of the frame component 206.

In this embodiment, a cathode layer 224 (e.g., an electroless metal layer) is disposed and/or formed over the primer layer 222. The cathode layer 224 is typically disposed using an electroless plating technique, although other means of disposing and/or forming the cathode layer 224 onto the primer layer 222 may be used. In some cases, the cathode layer 224 can be formed in the same operation as the cathode layer 224 shown in FIG. 2G.

Thereafter, the metal layer 212 may be formed over the cathode layer 224 using an electroplating technique. In many cases, electroplating over the cathode layer 224 may take place at the same time as electroplating over the cathode layer 224, although this may not be required.

In some examples, an activation layer may be applied to the primer layers 218, 222 and applied over the outer cover 208 and the frame component 206 in order to facilitate or improve bonding of the cathode layers 220, 224 to the primer layers 218, 222. In one embodiment depicted in FIGS. 2I-2J, the activation layers 226, 228 are disposed as a thin layer of palladium, titanium, and/or nickel (or another suitable metal or alloy) between the primer layers 218, 222 and the cathode layers 220, 224 of the outer cover 208 and the frame component 206, respectively. In other cases, an activation layer may not be required or may be implemented in another implementation-specific and suitable manner. In other cases, the activation layer may be a portion of the primer layers 218, 222. For example, the primer layers 218, 222 can include porous regions that accommodate palladium (or another metal). In these examples, when an electroless metal layer is formed over the primer layers 218, 222, the electroless metal can partially occupy the porous regions. In this manner, the electroless metal layer—and any layer subsequently bonded to the electroless metal layer, such as an electroplated metal layer—can mechanically bond to the primer layers 218, 222.

It may be appreciated that the foregoing description of the embodiment(s) depicted in FIGS. 2B-2H, and various alternatives thereof and variations thereto are presented, generally, for purposes of explanation, and to facilitate a thorough understanding of various possible configurations of an enclosure with a metal layer disposed on an internal surface thereof as contemplated herein. However, it will be apparent to one skilled in the art that some of the specific details presented herein may not be required in order to practice a particular described embodiment, or an equivalent thereof.

For example, in some embodiments, a primer layer and activation layer (or, otherwise, a primer layer that is activated) and/or an electroless metal layer may not be required. For example, a physical vapor deposition technique can be used, in some embodiments, to dispose an intermediate metal layer suitable for electroforming or electroplating. In these cases, any suitable physical vapor deposition metal, or combination of metals, can be used. In some embodiments, different metals can be layered atop one another in sequential physical vapor deposition operations.

Thus, the foregoing and following descriptions and specific embodiments are understood to be presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings. Particularly, it may be understood that the embodiments depicted in FIGS. 2B-2H can be implemented in a number of suitable ways.

For example, in some embodiments, the metal layer can be formed around a perimeter of the front enclosure piece 202 of the enclosure 200. By forming a metal boundary or metal sidewall around the perimeter of the front enclosure piece 202 in this manner, a metal bumper is formed. The metal bumper is configured to absorb energy associated with impact events and may serve to protect the front enclosure piece 202.

Figure 2K:
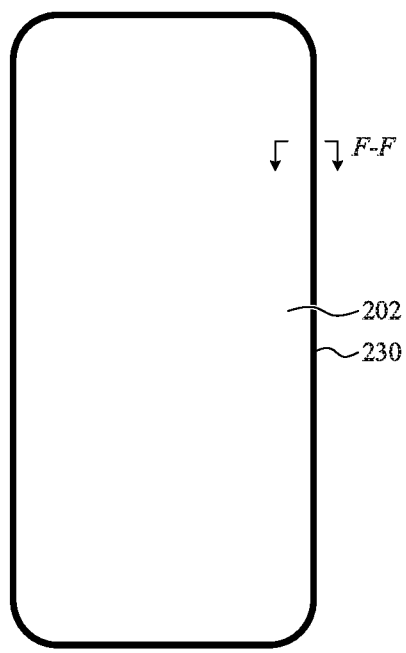
FIG. 2K depicts a simplified view of the front enclosure piece of the enclosure depicted in FIG. 2A, specifically showing a metal bumper formed along a perimeter of the front enclosure piece.
Figure 2L:
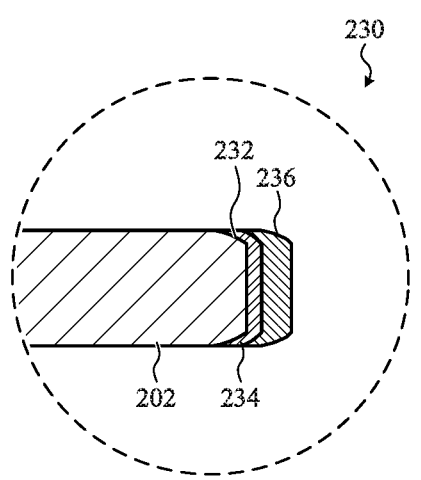
FIG. 2L depicts a detail view of FIG. 2K, specifically showing an activation layer applied to the primer layer.

More specifically, as shown in FIG. 2K, a metal bumper 230 can be formed along the periphery of the front enclosure piece 202. As shown in FIG. 2L, the metal bumper 230 can be electroplated onto a roughened edge 232 (or otherwise shaped edge) of the front enclosure piece 202. More specifically, the metal bumper 230 can be electroplated onto a primer and cathode layer 234 that is formed, in an electroless process, onto the roughened edge 232. In other embodiments, the metal bumper 230 can be electroplated onto a metal layer that is deposited via physical vapor deposition.

The metal bumper further includes a ductile metal 236 that is electroplated onto the primer and cathode layer 234. The ductile metal 236 can improve the edge impact resistance of the front enclosure piece 202 by absorbing and distributing impact energy that might otherwise be absorbed by the front enclosure piece 202.

Figure 2M:
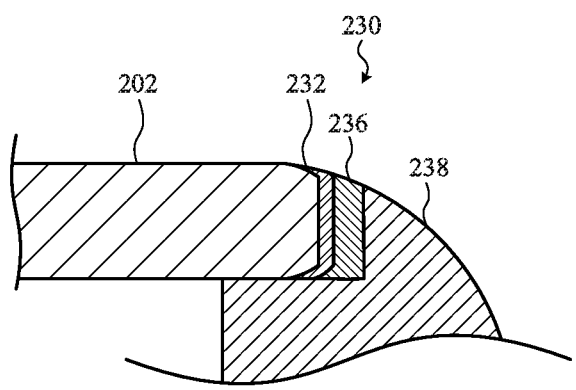
FIG. 2M depicts a metal bumper, such as shown in FIGS. 2K-2L, that forms a continuous surface between a front enclosure piece and a frame component of a back enclosure piece, such as described herein.

Further, in many cases, the metal bumper 230 and the front enclosure piece 202 can be finished in the same operation; co-polishing of the respective work surfaces can reduce complexity of manufacture of an electronic device accommodated in the enclosure 200. In further embodiments, for example as shown in FIG. 2M, the metal bumper 230 can be co-polished with the front enclosure piece 202 and a frame component 238. In this example, the metal bumper 230 can serve as a portion of a smooth outer surface of an electronic device.

Returning to FIG. 2L, as noted above, the metal bumper 230 can be formed from any number of suitable metal materials, but in many embodiments, the metal bumper 230 is formed from a ductile metal configured to absorb impact events. For example, in some embodiments, nickel or copper may be used. In other cases, other metals or alloys may be suitable. Further, in other embodiments, a metal bumper may be additionally or alternatively applied to a sidewall or edge of an outer cover, such as the outer cover 208 depicted in FIG. 2A.

In still further examples, the metal layer can be formed into a particular shape or can be formed with a particular topology or geometry that is non-uniform through the cross-section of the tray portion. In other cases, the metal layer can be formed in a manner that facilitates bonding of other components to the metal layer itself. Generally and broadly, FIGS. 3A-3C depict examples of such embodiments.

Figure 3A:
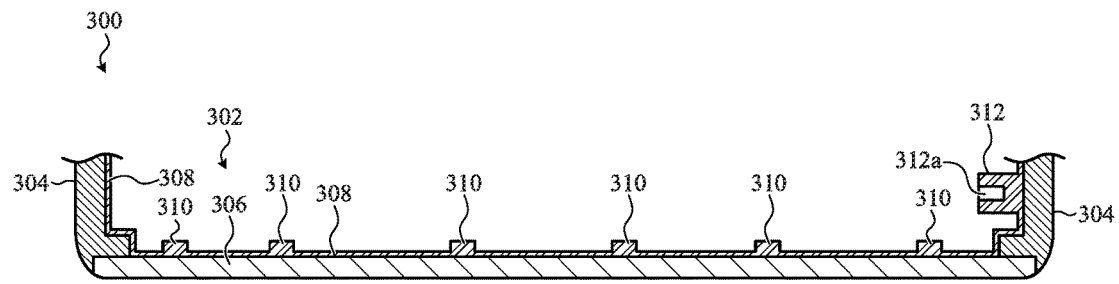
FIG. 3A depicts a cross-section view of a back enclosure piece for an electronic device enclosure, specifically showing one or more bosses formed on a metal layer of the back enclosure piece.
Figure 3B:
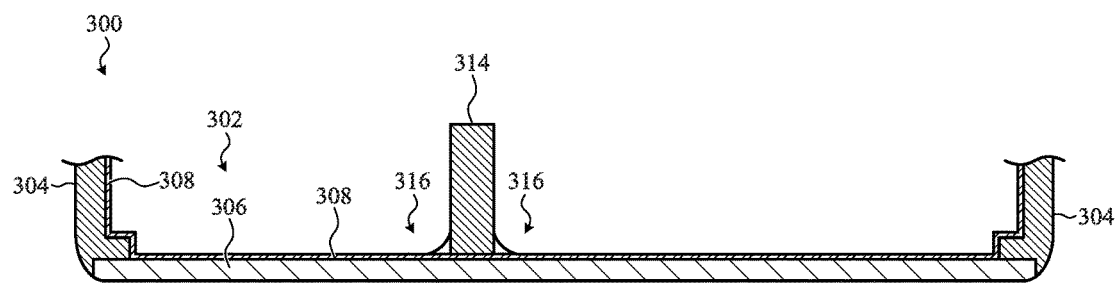
FIG. 3B depicts a cross-section view of another back enclosure piece for an electronic device enclosure, specifically showing a fixing element welded or soldered to a metal layer of the back enclosure piece.
Figure 3C:
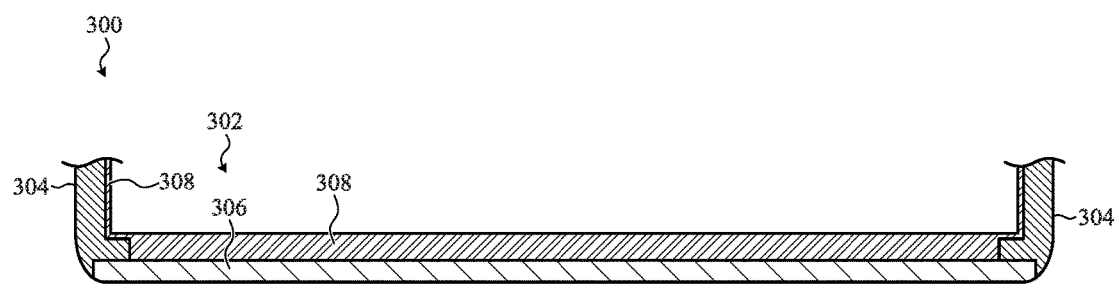
FIG. 3C depicts a cross-section view of another back enclosure piece for an electronic device enclosure, specifically showing a metal layer having variable thickness.

More specifically, FIGS. 3A-3C depict a cross-section of a back enclosure piece 300 of an enclosure showing different example embodiments of a metal layer. As with other embodiments described herein, the metal layer is formed onto an interior surface of the back enclosure piece. The metal layer may be applied in an electroforming process, but this may not be required. More specifically, the metal layer can be formed by electroplating onto a cathode layer disposed onto an interior surface of the enclosure. The cathode layer may be formed over a primer layer chosen for its ability to provide strong adhesion between the cathode layer and to the material onto which the primer layer is applied.

As with other embodiments described herein, the back enclosure piece 300 has an internal volume 302 that is defined, in part, by a frame component 304 and in part by an outer cover 306. In some examples, the frame component 304 is formed from metal and the outer cover 306 is formed from a non-metal material although this is not required.

As noted above, a metal layer 308 can be formed on one or more internal surfaces of the internal volume 302. As shown in FIGS. 3A-3C, the metal layer 308 is formed over the entire internal surface of the internal volume 302. More specifically, the metal layer 308 is formed over each sidewall and the bottom of the back enclosure piece 300. It may be appreciated, however, that such a configuration may not be required of all embodiments and that the metal layer 308 can be disposed in any suitable manner or in any suitable pattern.

For example, FIG. 3A depicts a cross-section view of the back enclosure piece 300, specifically showing bosses 310 formed on the metal layer 308. The bosses 310 are depicted as formed onto the outer cover 306, but this may not be required of all embodiments. For example, a boss 312 may be formed onto a portion of the sidewall of the frame component 304. In other cases, the bosses 310, 312 may be placed onto and affixed to the outer cover 306 by soldering, welding, brazing, mechanical fastening, adhering, or any other suitable or implementation-specific means (or combinations thereof) of bonding the bosses 310, 312 to the outer cover 306. In these cases, the bosses 310, 312 may be bonded to the metal layer 308 after the metal layer 308 is formed. In other cases, the bosses 310, 312 may be added while the metal layer 308 is being formed such that the metal layer 308 is partially formed around or in the bosses 310, 312. In some cases, the bosses 310, 312 may be formed from the same material as the metal layer 308, although this is not required of all embodiments.

The bosses 310, 312 can be used for any suitable purpose. For example, the bosses 310, 312 may be used to attach to one or more structural or functional components of an electronic device disposed within the back enclosure piece 300. For example, one or more of the bosses 310, 312 may be tapped (such as with the tap 312a) in order to receive and retain a screw or other fastener. In another example, the bosses 310, 312 may be configured to solder or weld to another component. In other cases, the other component may be coupled directly to the metal layer 308. For example, as shown in FIG. 3B, a fixing element 314 can be soldered directly to the surface of the metal layer 308 with solder 316. The fixing element 314 can be any element suitable for affixing to the metal layer 308. For example, the fixing element 314 can be a portion of an electrical circuit. In another example, the fixing element 314 is a portion of a structural frame or structural component that provides support to the back enclosure piece or to another enclosure piece. In yet another example, the fixing element 314 is a portion of a thermal path from a thermal source to a thermal sink or heat spreader. In yet another example, the fixing element 314 is a portion of an electrical sensor. In some cases, the fixing element 314 serves more than one function. For example, the fixing element 314 may be a portion of a thermal path and a portion of an electrical circuit.

It may be appreciated that the foregoing description of the embodiment depicted in FIGS. 3A-3B, and various alternatives thereof and variations thereto are presented, generally, for purposes of explanation, and to facilitate a thorough understanding of various possible configurations of a metal layer disposed on an internal surface of an enclosure such as contemplated herein. However, it will be apparent to one skilled in the art that some of the specific details presented herein may not be required in order to practice a particular described embodiment, or an equivalent thereof. For example, although the metal layer 308 is depicted as having a substantially continuous average thickness, this may not be required. For example, the metal layer 308 may have a different average thickness along the outer cover 306 than the frame component 304, such as shown in FIG. 3C.

Therefore, the foregoing and following descriptions and specific embodiments are understood to be presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings. Particularly, it may be understood that the embodiments depicted in FIGS. 3A-3C can be implemented in a number of suitable ways.

Figure 4:
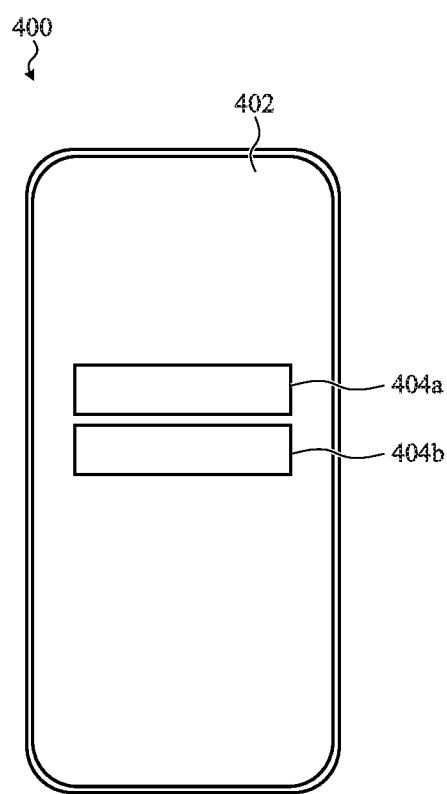
FIG. 4 depicts a back enclosure piece for an electronic device enclosure, specifically showing a functional and/or cosmetic aperture defined by a metal layer of the back enclosure piece.

In other embodiments, a metal layer can be formed in a different manner. For example, as noted above, a metal layer need not be formed over the entire interior surface of a tray portion of the enclosure. Particularly, as shown in FIG. 4, a back enclosure piece 400 can include a metal layer 402 that defines an aperture 404a and an aperture 404b. The apertures 404a, 404b may take any suitable shape. In many cases, the apertures 404a, 404b may function as an antenna window. In other cases, the apertures 404a, 404b can function as an aesthetic aperture.

The apertures 404a, 404b may be formed in any suitable manner, in the same process or operation or in different processes or operations. For example, the aperture 404a can be formed by masking a portion of an outer cover prior to applying a primer layer. In other cases, the aperture 404b can be formed by masking a portion of a primer layer before applying a cathode layer. In some cases, more than one aperture can be formed. In this example, the primer layer may extend through the aperture 404a. In these cases, if the primer layer includes a pigment, the aperture 404a may not be visible from the exterior of the back enclosure piece 400.

Figure 5:
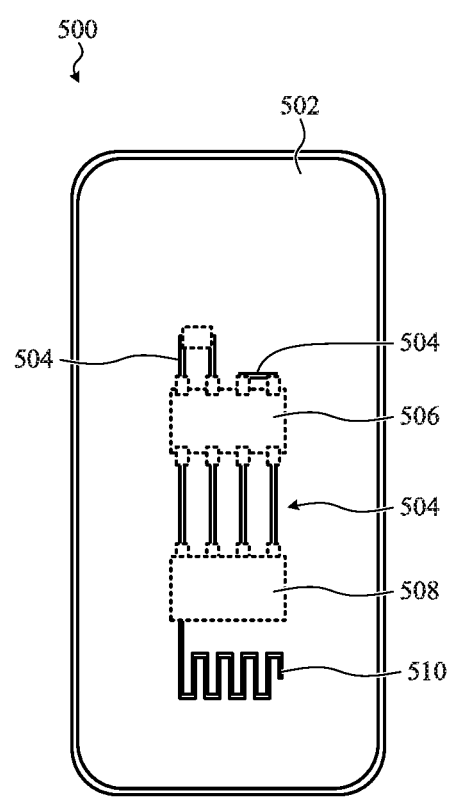
FIG. 5 depicts a back enclosure piece for an electronic device enclosure, specifically showing circuit traces defined by a metal layer of a back enclosure piece.

In certain cases, the metal layer can take a particular shape. For example, as shown in FIG. 5 a back enclosure piece 500 has an outer cover 502 onto which a metal layer 504 is formed as a pattern. As shown the metal layer 504 can be formed in several electrically-isolated paths that can be used to connect one electrical component 506 to another electrical component 508. In another example, the metal layer 504 can be formed as an antenna 510.

Figure 6:
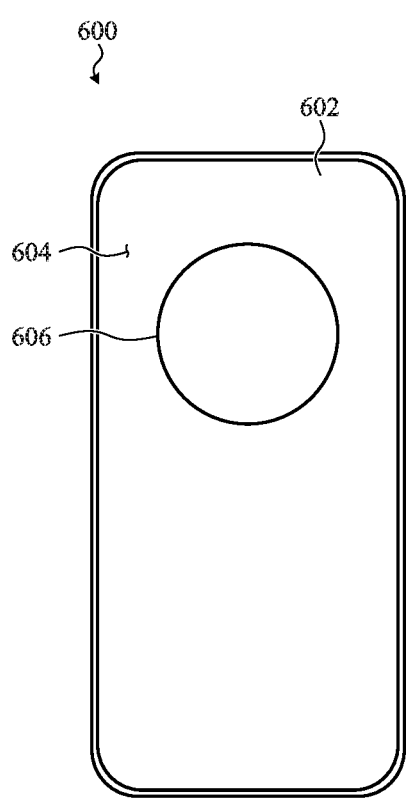
FIG. 6 depicts a back enclosure piece for an electronic device enclosure, specifically showing an antenna aperture and/or wireless charging aperture defined by a metal layer of the back enclosure piece.

In still further embodiments, the metal layer can define one or more windows. For example, as shown in FIG. 6, a back enclosure piece 600 has an outer cover 602 onto which a metal layer 604 is formed. The metal layer 604 defines a window 606. The window 606 can be formed in any suitable shape; as illustrated, the window 606 is circular, but this is not required. The window 606 can be formed through the metal layer 604 to support, without limitation: wireless communication systems, inductive power transfer systems, resonant power transfer systems, wireless payment communication systems, biometric authentication systems, camera or imaging systems, capacitive sensing systems, display systems, electric field communication systems, sensor systems, touch or force input systems, and so on.

Figure 7A:
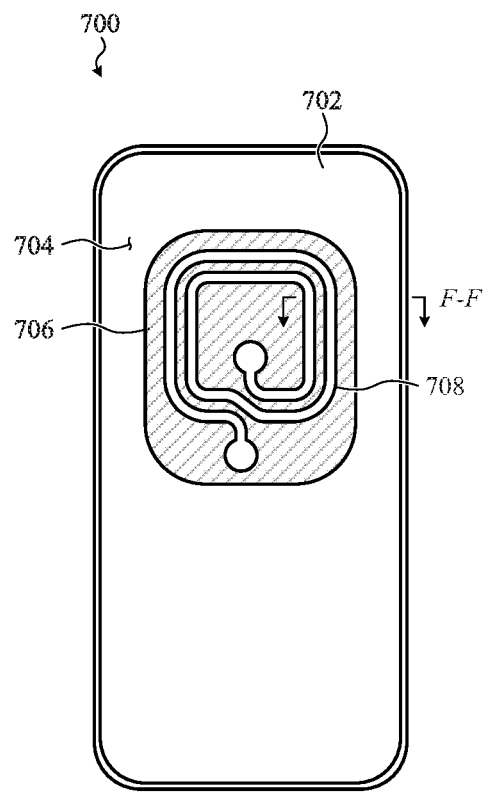
FIG. 7A depicts a back enclosure piece for an electronic device enclosure, specifically showing a wireless charging aperture defined by a metal layer of the back enclosure piece.
Figure 7B:
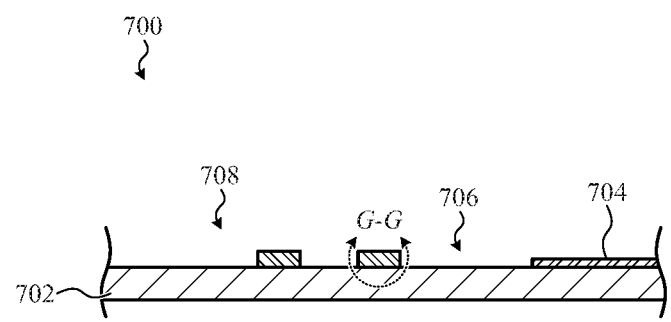
FIG. 7B depicts a cross-section view of the back enclosure piece of FIG. 7A taken through line F-F.

For example, as shown in FIGS. 7A-7B, a window defined by the metal layer can be shaped to accommodate an inductive coil (e.g., inductor) of a wireless power transfer system. In the illustrated embodiment, a back enclosure piece 700 has an outer cover 702 (or layer) onto which a metal layer 704 is formed using techniques, or combinations thereof, such as described herein. In addition, in this embodiment, the back enclosure piece 700 includes a primer layer with a pigment that provides a specific color to the back enclosure piece 700.

In these examples, the outer cover 702 can be formed from glass, but this may not be required. The metal layer 704 defines a window 706 that is sized larger than an inductive coil 708. The inductive coil 708 can be used to transmit or receive power and may be operated in an inductive mode or a resonant mode. In another non-limiting phrasing, the metal layer 704 includes two electrically isolated regions: a region external to the window 706 and a region within the window 706. In particular, the illustrated embodiment depicts the inductive coil 708 as the region of the metal layer 704 within the window 706, but this may not be required. In many cases, the region external to the window 706 can be configured to operate as a heat spreader or heat sink. In still further embodiments, the heat spreader region may not be required; an inductive coil 708 can be formed directly onto the outer cover 702.

In other embodiments, the inductive coil 708 can be formed onto the outer cover 702. For example, the inductive coil 708 can be formed onto the exposed surface of the metal layer 704 within the window 706. In some cases, the inductive coil 708 is formed with the metal layer 704, but this may not be required and the inductive coil 708 can be formed in a subsequent process or in any suitable manner using the same or similar techniques used to dispose or form the metal layer 704.

For example, either or both the inductive coil 708 or the coil turn layer 716 (see, e.g., FIG. 7C) can be formed by electroplating a selected plating metal (e.g., copper, silver, gold, and so on) onto a metallized layer—formed in an electroless process—onto the outer cover 702. In these embodiments, the inductive coil 708 is substantially thinner (e.g., lower z-height or stack height) than a conventional inductive coil, which is typically formed with magnet wire. In these embodiments, the inductive coil 708 is typically separated from the outer cover 702 (and/or a primer layer disposed onto the outer cover 702) by an insulating layer, such as a polymer insulating layer.

Figure 7C:
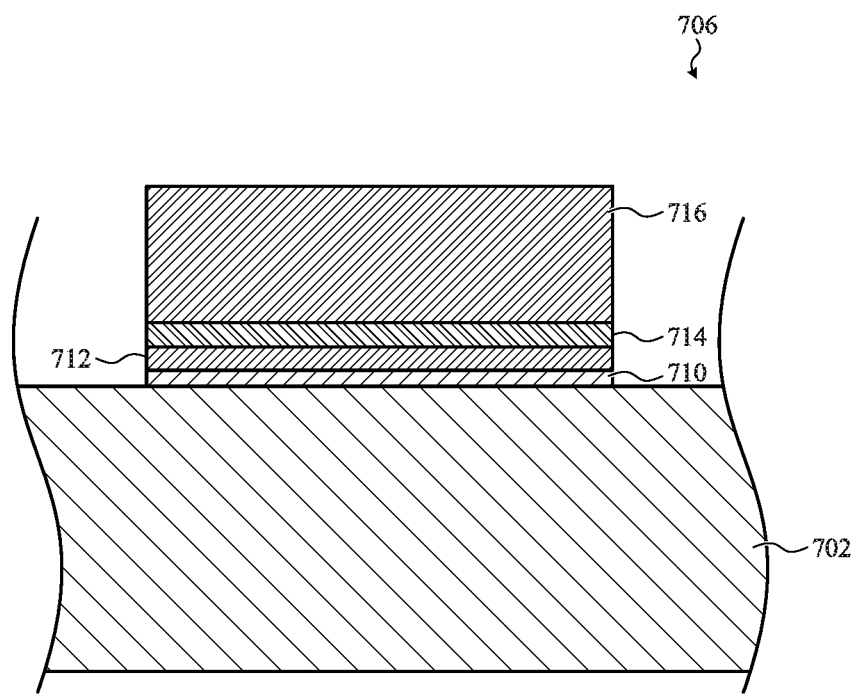
FIG. 7C depicts a detail view of the enclosed circle G-G of the back enclosure piece cross-section depicted in FIG. 7B, specifically showing a primer layer and a cathode layer disposed between the non-metal portion of the back enclosure piece and the metal layer.

FIG. 7C depicts one example series of layers that may be used to form an inductive coil onto an outer cover, such as the inductive coil 708 onto the window portion 706 of the outer cover 702 depicted in FIGS. 7A-7B.

In this embodiment, as with other embodiments described herein, a primer layer can be applied to the window 706. In this embodiment, the primer layer is identified as the primer layer 710. The primer layer 710 can be formed from any number of suitable materials or combination of materials. In many embodiments, the primer layer 710 is formed from a material selected for that material's ability to bond to the non-metal material (e.g., glass) selected for the outer cover 702. In one example, the primer layer 710 is a polymer-based adhesive. In some cases, the primer layer 710 includes a pigment whereas in other cases the primer layer 710 can be disposed over an ink layer that is provided on the surface of the outer cover 702. In such cases, the primer layer 710 may be a clear-coat configured to bond to and encapsulate or protect the ink layer.

As noted with respect to other embodiments described herein, the primer layer 710 can be disposed over the entire interior surface of the window 706, whereas in other cases the primer layer 710 is disposed over only a portion of the interior surface of the outer cover 702 and/or within the window 706 (e.g., via dry or wet mask and etch, photolithography, and so on). In such an embodiment, the primer layer 710 can be formed in a spiral pattern, so as to define the inductive coil 708.

As noted with respect to other embodiments described herein, the window 706 may undergo a preparation operation prior to application of the primer layer 710. The preparation operation can include, but is not limited to: cleaning one or more surfaces of the window 706; rinsing one or more surfaces of the window 706; polishing one or more surfaces of the window 706; chemical strengthening of one or more surfaces of the window 706; roughening one or more surfaces of the window 706; and/or any other suitable preparation operation or combination or series of preparation operations.

In one non-limiting example, one or more surfaces of the window 706 can be roughened prior to applying the primer layer 710. Roughening of these surfaces promotes adhesion between the primer layer 710 and the material of the outer cover 702.

Once the primer layer 710 is disposed on the surface of the window 706, it may be activated. In one example, activation can occur by depositing an activation layer 712 over the primer layer 710. In other cases, a solvent can dissolve—to a selected depth—a portion of the primer layer 710. Once partially dissolved, an oxidation operation can be performed that defines a high number of holes within the primer layer 710. Thereafter a palladium solution can be applied to the oxidized primer layer 710 in order to activate the layer. It may be appreciated that, in this embodiment, the activation layer 712 depicted in FIG. 7C is a region of the primer layer 710 and may not necessarily be a separate layer.

Once the primer layer 710 is activated (or an activation layer 712 is provided over the primer layer 710), a cathode layer 714 can be formed over the primer layer 710. The cathode layer 714 is typically disposed by an electroless plating technique, although other means of disposing and/or forming the cathode layer 714 onto the primer layer 710 may be used. The cathode layer 714 may be 1.0 micrometer thick. In other embodiments, the cathode layer 714 can have a different thickness. In a typical example, the cathode layer 714 is formed with electroless nickel or electroless copper.

Thereafter, a coil turn layer 716 may be formed over the cathode layer 714 using an electroplating technique. The coil turn layer 716 defines the coil turns of the inductive coil 708. Typically, the coil turn layer 716 is formed from copper, but other metals may be suitable.

Figure 7D:
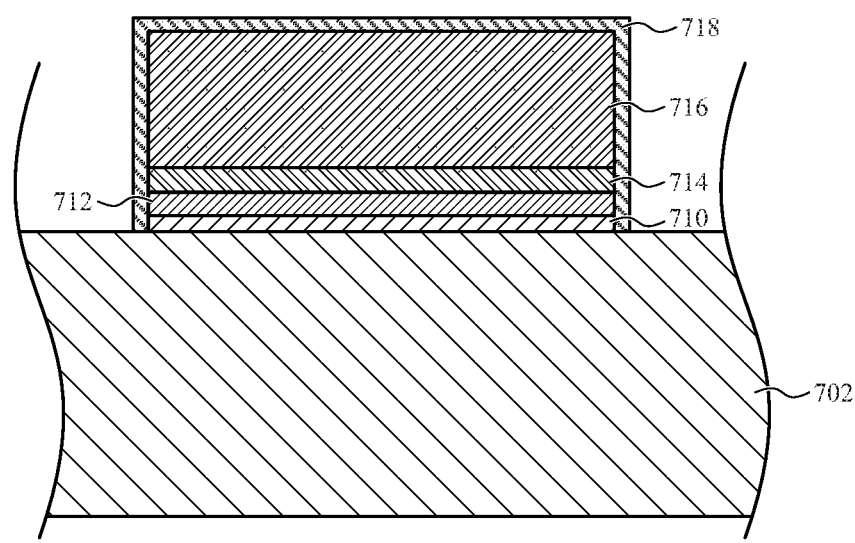
FIG. 7D depicts an alternate detail view of the enclosed circle G-G of the back enclosure piece cross-section depicted in FIG. 7B, specifically showing a protective outer layer.

In further embodiments, such as shown in FIG. 7D, the coil turn layer 716 can be encapsulated and/or sealed within a second electroless layer 718. The second electroless layer 718 can be a passivation layer; a layer suited to protect the coil turn layer 716 from corrosion.

Figure 7E:
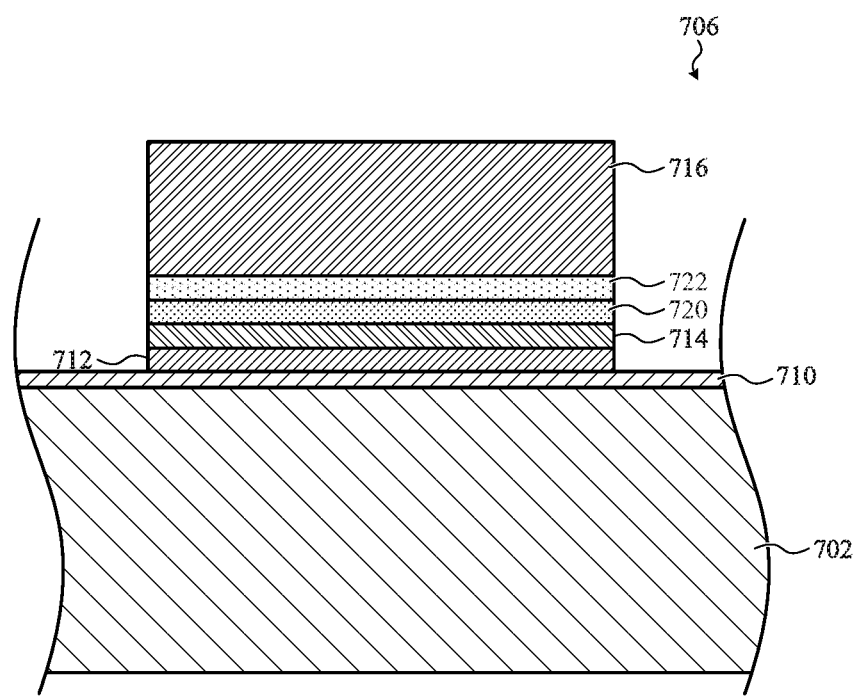
FIG. 7E depicts another alternate detail view of the enclosed circle G-G of the back enclosure piece cross-section depicted in FIG. 7B, specifically showing an insulator layer separating the metal layer and the primer layer.

In still further examples, such as shown in FIG. 7E, an inductive coil can be formed over one or more insulation layers. In this illustrated embodiment, an insulating polymer layer is disposed over the cathode layer 714. This layer is identified in the figure as the first insulation layer 720. Next, a second insulation layer 722 can be disposed over the first insulation layer 720. The second insulation layer 722 can be suitable for electroless plating or metallization. Once the second insulation layer 722 is metallized, the coil turn layer 716 can be formed via an electroplating process. In other embodiments, only a single insulation layer may be required.

Figure 8:
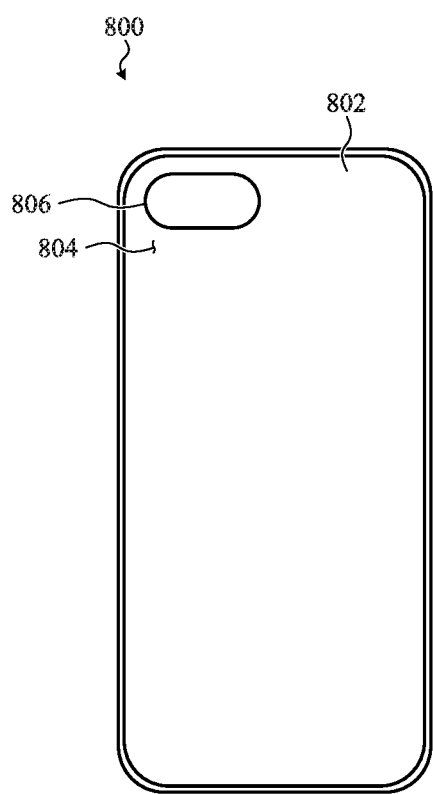
FIG. 8 depicts a back enclosure piece for an electronic device enclosure, specifically showing a camera or imaging aperture defined by a metal layer of the back enclosure piece.

In still further embodiments, the metal layer can define one or more windows that can accommodate one or more imaging systems, such as digital cameras. For example, as shown in FIG. 8 a back enclosure piece 800 has an outer cover 802 onto which a metal layer 804 is formed. The metal layer 804 defines a window 806. The window 806 can be formed to accommodate one or more camera modules (not shown). In this embodiment, the outer cover 802 is typically optically transparent.

Figure 9:
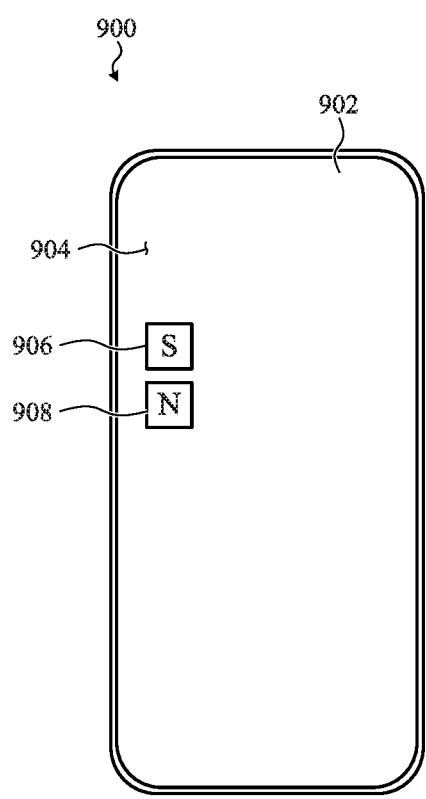
FIG. 9 depicts a back enclosure piece for an electronic device enclosure, specifically showing a magnetized region defined by a metal layer of the back enclosure piece.

In still further embodiments, the metal layer can define one or more magnetic regions. For example, as shown in FIG. 9 a back enclosure piece 900 has an outer cover 902 onto which a metal layer 904 is formed. In this embodiment the metal layer 904 can be formed from a magnetic metal, such as steel, nickel, or iron. In a manufacturing process, regions of the metal layer 904, such as the region 906 or the region 908, can be exposed to magnetic fields, thereby forming permanent magnetic regions within the metal layer 904.

It may be appreciated that the foregoing description of the embodiments depicted in FIGS. 4-9, and various alternatives thereof and variations thereto are presented, generally, for purposes of explanation, and to facilitate a thorough understanding of various possible configurations of a metal layer disposed on an internal surface of an enclosure such as contemplated herein. However, it will be apparent to one skilled in the art that some of the specific details presented herein may not be required in order to practice a particular described embodiment, or an equivalent thereof.

Generally and broadly, FIGS. 10-20 depict flow charts of various methods of applying a metal layer to a surface of an electronic device enclosure. In many cases, the surface is an internal surface, but this may not be required of all embodiments and it may be appreciated that the techniques described herein may be applied to external surfaces of electronic device enclosures as well.

In many cases, the metal layer may be applied (to either the interior or exterior of an enclosure or enclosure component) in a progressive electroforming process, but this may not be required. For example, a metal layer can be formed by electroplating onto a cathode layer plated by electroless plating onto an interior surface of the enclosure. The cathode layer may be formed onto a primer layer chosen for its ability to provide strong adhesion between the cathode layer and the material of the enclosure or enclosure component.

As with other embodiments described herein, an enclosure can include an outer cover and a back enclosure piece, although this may not be required and other portions or parts of an enclosure can be joined using the techniques described and referenced below. However, for simplicity of description the embodiments that follow are described in reference to an enclosure defined by an outer cover and a back enclosure piece. In this example, the metal layer (or more than one layer) may be formed onto one or more sections of the back enclosure piece. In many cases, the back enclosure piece is formed from a frame component and an outer cover, one of which may be a metal and one of which may be a non-metal.

The metal layer, formed using methods such as those described below, typically overlaps interior surfaces of the frame component and outer cover of the back enclosure piece so as to strengthen the interface and/or bond between those components. In other cases, the metal layer may be formed separately on the frame component and the outer cover. In a subsequent operation, the separate metal layers may be bonded together using any suitable technique such as, but not limited to welding, soldering, brazing, and so on.

In some cases, the operations of the various methods depicted in FIGS. 10-20 may be performed at different times or in a different order from that depicted. In some cases, supplemental operations may be performed before or with the depicted operations. For example, supplemental operations may include, but are not limited to: glass or plastic solidification processes; singulation processes; surface roughening and/or scoring processes (e.g., laser ablation, particle/bead blast, chemical etching, nanoscale roughening, nanoscale feature or recess forming, and so on); chemical strengthening processes; ink/pigment deposition processes; cleaning/rinsing processes; activator processes; microlayer/activator deposition processes (e.g., palladium or nickel activator layer); charge neutralizer processes; and so on.

Figure 10:
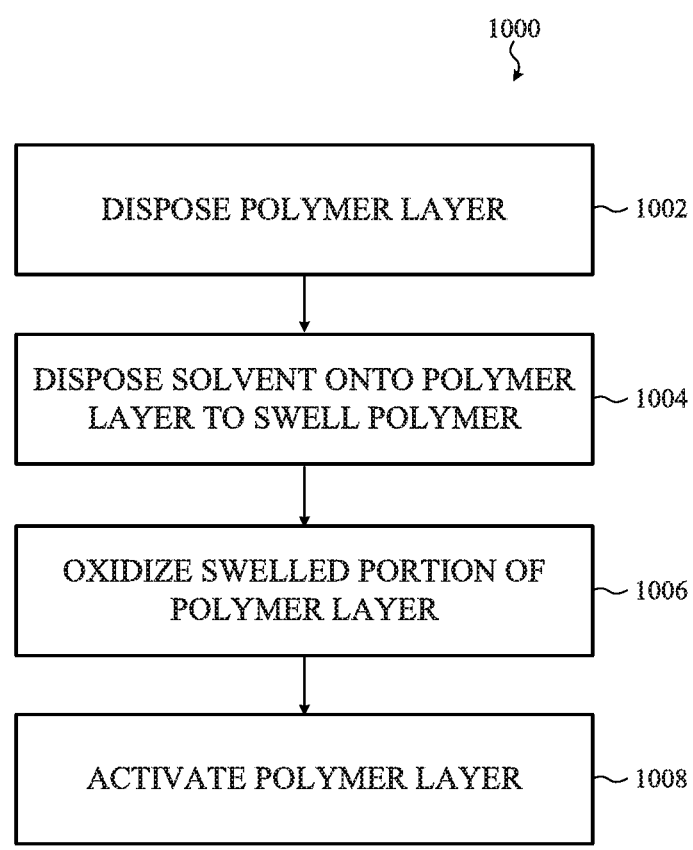
FIG. 10 depicts example operations of a method of preparing a non-metal material to receive a metal layer.

For example, FIG. 10 depicts a flow chart depicting example operations of a method of preparing a primer layer used to form a metal layer, such as described herein. The method can be performed in any suitable manner; the depicted operations are provided as a simplified example. Additional or fewer operations may be used.

The method 1000 begins at operation 1002 at which a polymer layer is disposed onto a substrate. The substrate can be a metal or a non-metal (e.g., dielectric). In some cases, the substrate is a frame component, whereas in other cases the substrate is an outer cover of a back enclosure piece of an enclosure.

Once the polymer layer is disposed, a solvent is applied to a top surface of the polymer layer at operation 1004. The solved is configured to swell the polymer layer by causing individual polymer chains to separate from adjacent chains, thereby increasing the volume of the layer. Next, at operation 1006, the swelled polymer layer can be subjected to oxidizing conditions. In some cases, an oxidizer is applied over the swelled polymer layer, whereas in others, the swelled polymer layer and substrate are subjected to an oxygen-rich environment for a predetermined period of time. Oxidation of the swelled polymer layer is configured to cause individual polymer chains nearby the surface of the polymer layer to break apart, thereby forming a porous region within the polymer layer.

Finally, at operation 1008, the polymer layer can be activated. In many cases a metal material (e.g., palladium) can be impregnated into the polymer layer to occupy or interface with the porous regions within the polymer layer opened and/or defined by the oxidation and swelling steps. Once activated with the metal material, the polymer layer and the substrate are prepared for an electroless plating or metallization process. In many cases, as noted above, the electroless plating process or metallization process can include placing the substrate in an electroless nickel bath or in an electroless copper bath.

Figure 11:
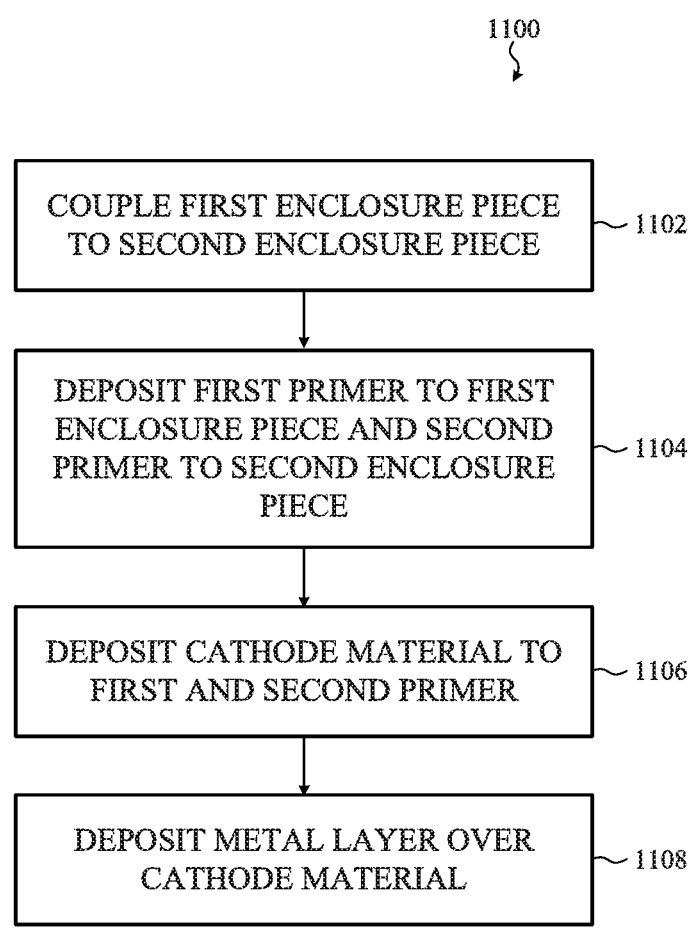
FIG. 11 depicts example operations of a method of forming a metal layer that overlaps at least two portions of a back enclosure piece of an electronic device enclosure.

FIG. 11 depicts a flow chart depicting example operations of a method of forming a metal layer that overlaps at least two portions of a back enclosure piece of an electronic device enclosure, such as the enclosure 200 shown in FIG. 2A. The method can be performed in any suitable manner; the depicted operations are provided as a simplified example. Additional or fewer operations may be used.

The method 1100 begins at operation 1102 in which a first enclosure piece is coupled to a second enclosure piece. In some examples, the first enclosure piece may be a frame component of a back enclosure piece and the second enclosure piece may be an outer cover of the back enclosure piece, such as the frame component 206 and the outer cover 208 as depicted in FIGS. 2A-2M. The first enclosure piece may be formed from metal and the second enclosure piece may be formed from a non-metal material such as, but not limited to glass, zirconia, ceramic, sapphire, wood, plastic, leather, and so on. In other cases, the first enclosure piece may be formed from the same material as the second enclosure piece.

The first enclosure piece can be coupled to the second enclosure piece in any number of suitable ways including, but not limited to: adhering the first enclosure piece to the second enclosure piece with an adhesive layer; welding the first enclosure piece to the second enclosure piece; interference fitting the second enclosure piece into the first enclosure piece; inserting a tab of the second enclosure piece into a complementary slot of the first enclosure piece; and so on.

In other cases, the first enclosure may not be bonded to the second enclosure piece. In these examples, the first and second enclosure pieces may be placed in a fixture; subsequent operations of the method 1100 may be performed with the first and second enclosure pieces held in the fixture.

The method 1100 continues at operation 1104 in which a first primer material is disposed onto the first enclosure piece and a second primer material is disposed onto the second enclosure piece. The first primer material may be selected for that material's ability to bond to the surface of the first enclosure piece. Similarly, the second primer material may be selected for that material's ability to bond to the surface of the second enclosure piece.

For example, in one embodiment the first enclosure piece is a frame component of a back enclosure piece, such as the frame component 206 of the back enclosure piece 204 depicted in FIGS. 2A-2M. Similarly, the first primer material may be a frame component primer material. In this example, the frame component can be formed from aluminum and the frame component primer material can be zincate. Zincate is selected in this example to facilitate bonding between the aluminum material and a cathode material disposed over the zincate in a later operation.

Continuing the example presented above, the second enclosure component may be an outer cover of the back enclosure piece, such as the outer cover 208 of the back enclosure piece 204 depicted in FIGS. 2A-2M. Similarly, the second primer material may be an outer cover primer material. The outer cover can be formed from a non-metal, such as glass, and the second primer can be a coating material that facilitates strong adhesion between metals and non-metals. The coating material is selected in this example to facilitate bonding between non-metal and a cathode material disposed over the coating material in a later operation.

In some embodiments, the second primer may also include a pigment. The pigment may take any suitable color or pattern/distribution of colors (e.g., image, cosmetic pattern, product labeling, product personalization, and so on). In some cases, the second primer may include an ink layer that is separate from a coating material such as described above. In a typical embodiment, the ink layer is disposed between the coating material and the second enclosure component, although this may not be required of all embodiments. The ink layer can include any suitable color or pigment. In one example, the ink layer includes carbon. In another example, the ink layer includes titanium dioxide.

As noted with respect to other embodiments described herein, the first and second primer layers can be formed in any suitable manner including, but not limited to: physical vapor deposition; sputtering; electrochemical plating; electroless plating; manual application techniques; and so on.

Also as noted with respect to other embodiments described herein, the first and second primer layers can be formed along the entire inner surface of the back enclosure piece. More specifically, the first and second primer layers can be formed over all internal sidewalls of the frame component and across the entire outer cover. In other embodiments, however, the first and second primer layers are not formed over the entire inner surface of the back enclosure piece. For example, the first and second primer layers may be formed in a pattern.

The method 1100 continues at operation 1106 in which a cathode layer is deposited onto the first primer layer and the second primer layer. In many cases, the cathode layer is a metal layer applied by electroless plating, although this may not be required. The cathode layer is typically electrically conductive so that the cathode layer can serve as the cathode of an electroplating operation.

The cathode layer can be formed using any suitable manner including, but not limited to: physical vapor deposition; sputtering; electrochemical plating; electroless plating; manual application techniques; and so on.

In many embodiments, the cathode layer can be formed along the entire inner surface of the back enclosure piece. More specifically, the cathode material can be formed over all internal sidewalls of the frame component and across the entire outer cover. In other embodiments, however, the cathode layer is not formed over the entire inner surface of the back enclosure piece. For example, the cathode layer may be formed in a pattern. In these examples, the cathode layer may also serve a cosmetic function.

The method 1100 continues at operation 1108 in which a metal layer is formed over the cathode layer. The metal layer can be formed using any suitable process, but is typically formed using electroplating techniques. In some embodiments, the metal layer is formed from a metal with high thermal conductivity, such as copper. In other embodiments, the metal layer is formed from a metal alloy, such as cobalt-nickel.

The type of metal chosen for the metal layer may vary from embodiment to embodiment or implementation to implementation. For example, copper may be chosen for high thermal conductivity whereas cobalt-nickel may be chosen for having a high elastic modulus.

The metal layer may be thermally or electrically coupled to an electrical circuit or component disposed within the enclosure. In some cases, the metal layer is a portion of an electrical circuit (e.g., circuit traces, antenna traces, jumper connections, grounding planes, and so on).

The thickness of the metal layer may be uniform or may vary. For example, the metal layer can be formed with one or more sections that are thicker than an average thickness of the metal layer. These thicker portions may provide structural support to the outer cover or the frame component of the back enclosure piece.

In many embodiments, the metal layer can be formed along the entire inner surface of the back enclosure piece. More specifically, the metal layer can be formed over all internal sidewalls of the frame component and across the entire outer cover. In other embodiments, however, the metal layer is not formed over the entire inner surface of the back enclosure piece. For example, the metal layer may be formed in a pattern. In these examples, the metal layer may also serve a cosmetic function.

Figure 12:
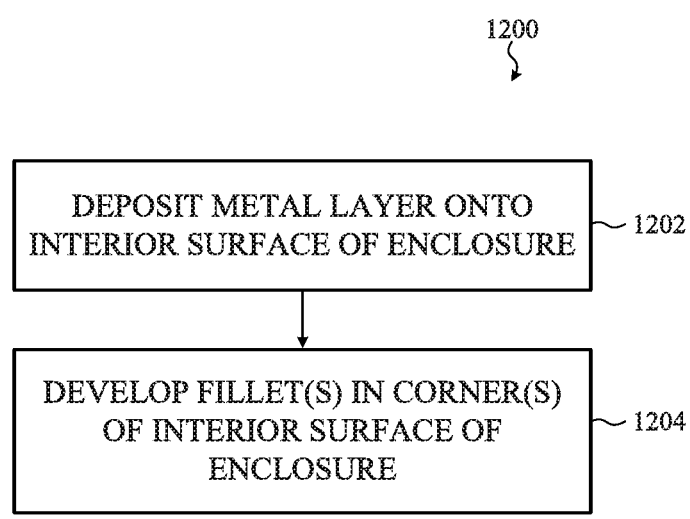
FIG. 12 depicts example operations of a method of forming a fillet between at least two portions of a back enclosure piece of an electronic device enclosure.

FIG. 12 depicts a flow chart depicting example operations of a method of forming a fillet between at least two portions of a back enclosure piece of an electronic device enclosure, such as the enclosure 200 shown in FIG. 2A. The method 1200 begins at operation 1202 at which a metal layer is disposed onto an interior surface of an electronic device enclosure. Thereafter, at operation 1204, a fillet is formed in one or more corners of the interior surface of the electronic device. The fillet may be of any suitable thickness. Generally, the fillet is formed to a thickness greater than an average thickness of the metal layer.

Figure 13:
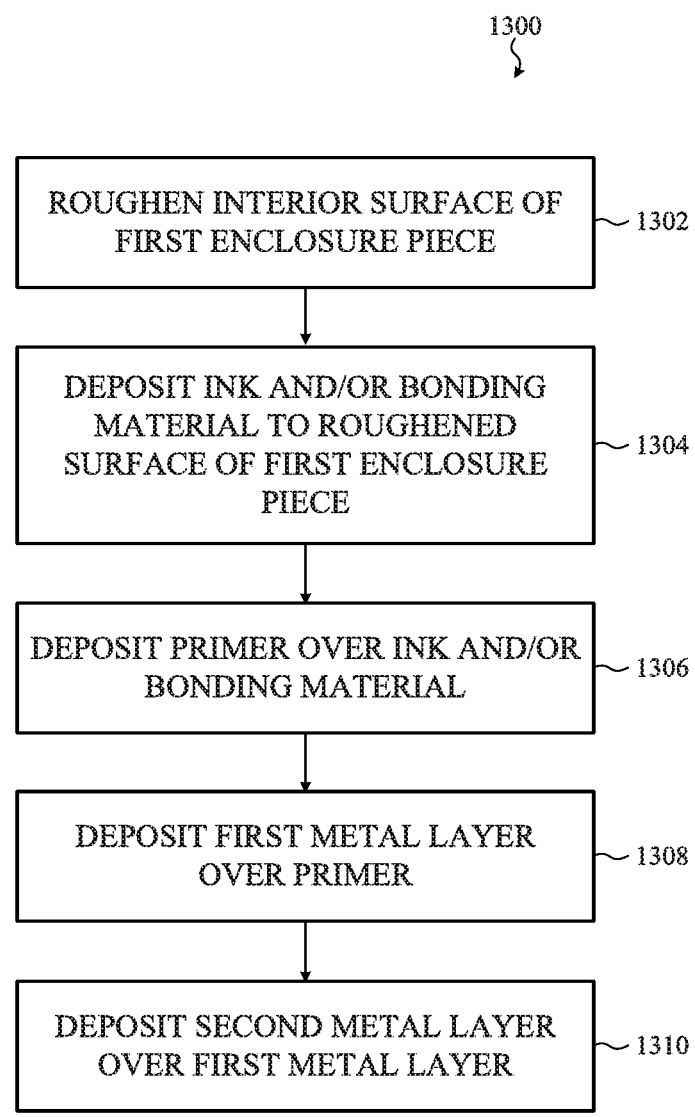
FIG. 13 depicts example operations of a method of forming a metal layer onto a non-metal material.

FIG. 13 depicts a flow chart depicting example operations of a method of forming a metal layer onto a non-metal material, such as shown on the outer cover 208 of the enclosure 200 shown in FIG. 2A. The depicted method can be performed in any suitable manner; the depicted operations are provided as a simplified example. Additional or fewer operations may be used. In some cases, portions of the method may be performed at different times.

The depicted example method 1300 begins at operation 1302 in which an interior surface of a first enclosure piece is roughened. In one example, the first enclosure piece may be an outer cover of a back enclosure piece of an enclosure, such as the outer cover 208 of the back enclosure piece 204 as shown in FIGS. 2A-2M. The outer cover can be formed from glass. The roughening operation may be performed in any suitable manner including, but not limited to chemical etching, laser ablation, scoring, particle blast, and so on.

In some embodiments, the entire interior surface of the first enclosure piece is roughened. In other cases, only a portion of the interior surface of the first enclosure piece is roughened. More particularly, in some embodiments, the interior surface of the first enclosure piece may be roughened in a pattern.

The amount of roughening may vary from embodiment to embodiment. In some cases rougher surfaces may be preferred. In other cases, smoother surfaces may be preferred. The degree of roughening may be selected based on material properties of various portions of the first enclosure piece.

Thereafter, at operation 1304, an ink and/or bonding layer is applied to the roughened portion of the first enclosure piece. Next, at operation 1306, a primer layer is disposed and/or formed onto the ink and/or bonding layer using suitable methods and techniques such as described herein. Next at operation 1308, a first metal layer is disposed over the primer layer. Next at operation 1310, a second metal layer is disposed over the first metal layer. In many examples, the second metal layer is formed by electroplating.

Figure 14:
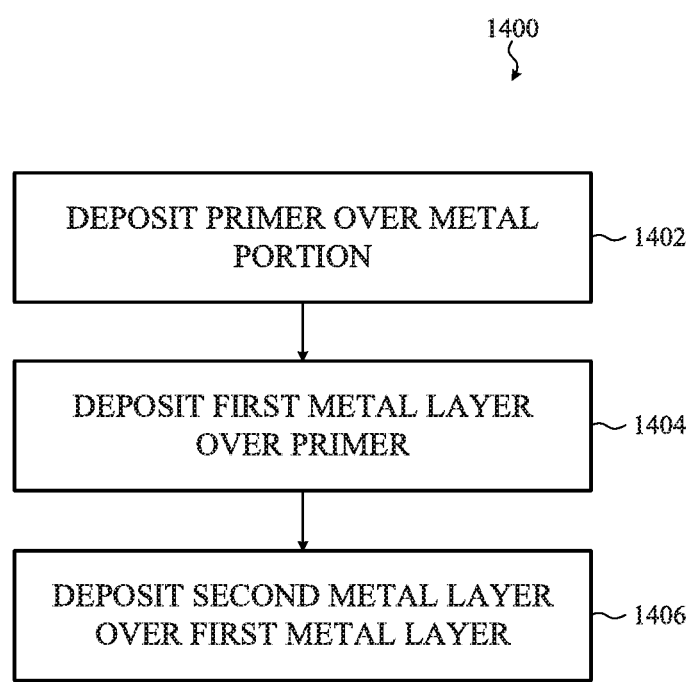
FIG. 14 depicts example operations of a method of forming a metal layer onto a metal material.

FIG. 14 depicts a flow chart depicting example operations of a method of forming a metal layer onto a metal material. As with other methods described herein, the method of FIG. 14 can be performed in any suitable manner; the depicted operations are provided as a simplified example. Additional or fewer operations may be used. In some cases, portions of the method may be performed at different times.

The method 1400 begins at operation 1402 in which a primer material is applied to a metal portion of an electronic device enclosure. Next at operation 1404, a first metal layer is applied over the primer material. Next, at operation 1406, a second metal layer is applied over the first metal layer. In many cases, the second metal layer is formed by electroplating. The first metal layer is typically formed by electroless plating, although this may not be required. For example, in some embodiments, the first metal layer can be formed by electroplating.

Figure 15:
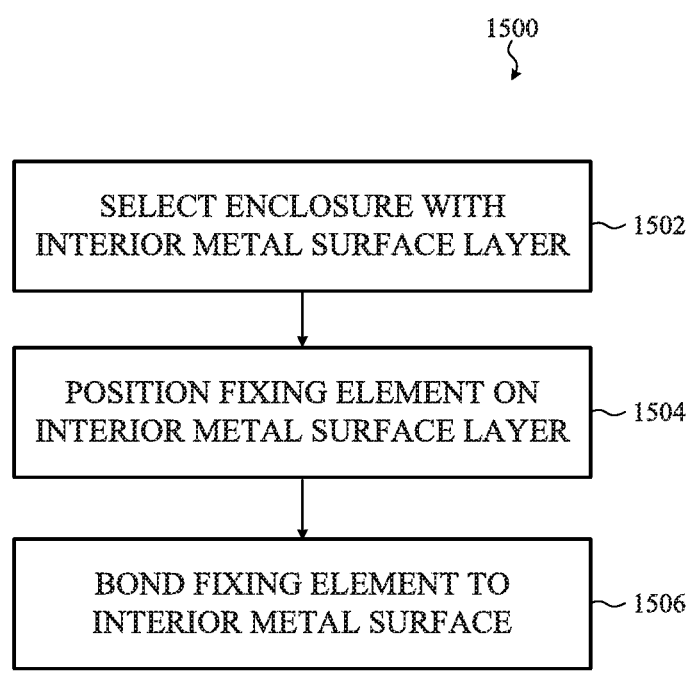
FIG. 15 depicts example operations of a method of bonding a fixing element to a metal surface.

FIG. 15 depicts a flow chart depicting example operations of a method of bonding a fixing element to a metal surface. The depicted method can be performed in any suitable manner; the depicted operations are provided as a simplified example. Additional or fewer operations may be used. In some cases, portions of the method may be performed at different times.

The method 1500 begins at operation 1502 in which an enclosure piece with a metal layer is selected. At operation 1504, a fixing element is position on a portion of the metal layer. The fixing element can be any element suitable for affixing to the metal layer. For example, the fixing element can be a portion of an electrical circuit. In another example, the fixing element is a portion of a structural frame that provides support to the enclosure piece or to another enclosure piece. In yet another example, the fixing element is a portion of a thermal path from a thermal source to a thermal sink. In yet another example, the fixing element is a portion of a heat spreader or a heat sink. In yet another example, the fixing element is a portion of an electrical sensor. In some cases, the fixing element serves more than one function. For example, the fixing element may be a portion of a thermal path and a portion of an electrical circuit.

Next, at operation 1506, the fixing element is bonded to the metal surface. The fixing element can be welded, soldered, brazed, or adhered to the metal surface. In another example, the metal surface may be tapped and the fixing element may be threaded; the two may be mechanically fastened to one another.

Figure 16:
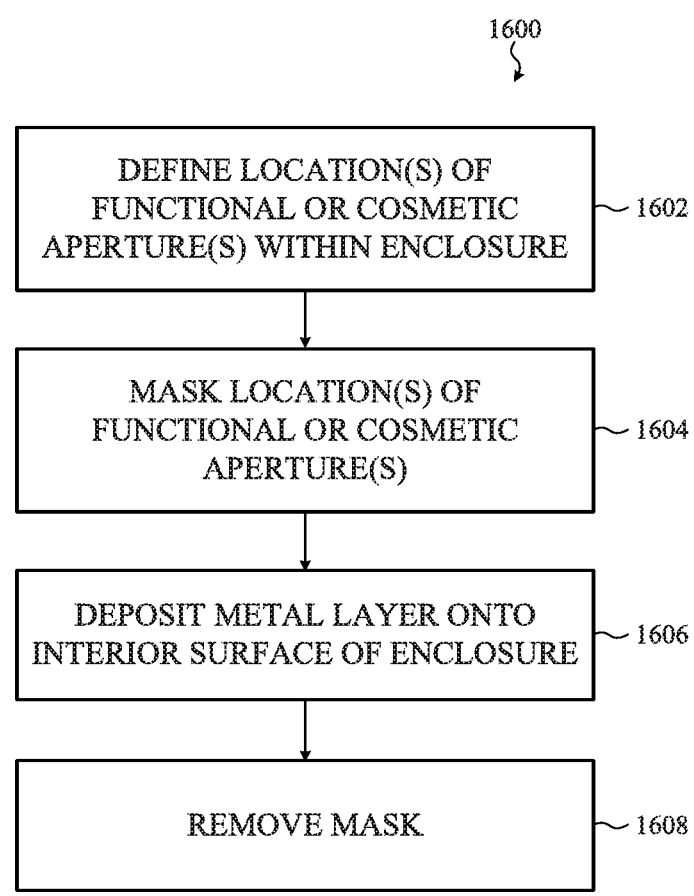
FIG. 16 depicts example operations of a method of forming a metal layer with one or more apertures.

FIG. 16 depicts a flow chart depicting example operations of a method of forming a metal layer with one or more apertures. As with other methods described herein, the method of FIG. 16 can be performed in any suitable manner; the depicted operations are provided as a simplified example. Additional or fewer operations may be used. In some cases, portions of the method may be performed at different times.

The method 1600 begins at operation 1602 in which the location of a functional or cosmetic aperture defined in an outer cover of an enclosure is selected. Next, at operation 1604, a mask layer or a resist layer is applied over the location of the aperture. The mask can be any suitable mask material. Next at operation 1606, a metal layer may be formed in a manner such as described herein. Next, at operation 1608, the mask layer is removed to expose the aperture.

In other cases, an aperture can be formed after the metal layer is formed. For example, an aperture can be formed by laser etching, chemical etching, and so on.

Figure 17:
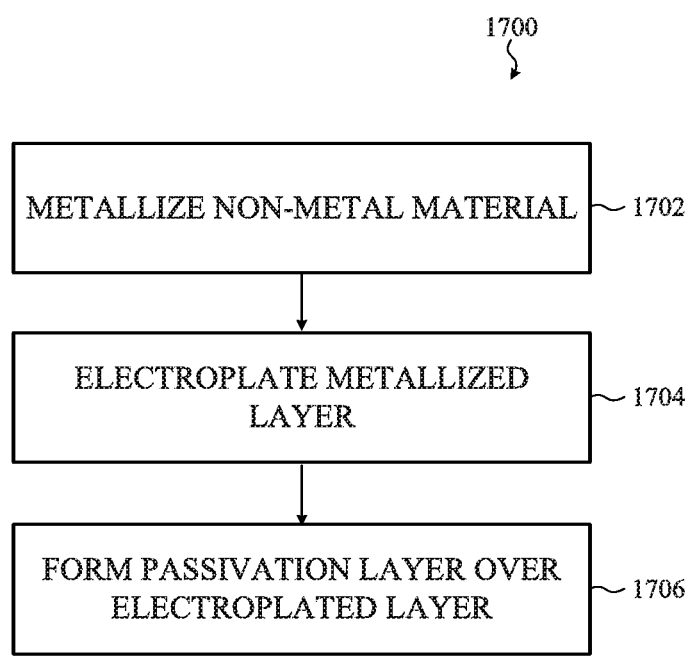
FIG. 17 depicts example operations of a method of forming a passivation layer over an electroplated layer.

FIG. 17 depicts a flow chart depicting example operations of a method of forming a metal layer that is protected with a passivation layer. As with other methods described herein, the method of FIG. 17 can be performed in any suitable manner; the depicted operations are provided as a simplified example. Additional or fewer operations may be used. In some cases, portions of the method may be performed at different times.

The method 1700 begins at operation 1702 in which a non-metal material is metallized. In one example, and as noted with respect to other embodiments described herein, a non-metal material may be glass that is roughened, coated with a primer that is subsequently activated, subjected to an electroless plating process (e.g., nickel or copper or another suitable electroless plating metal), and finally subjected to an electroplating process at operation 1704. In other cases, the electroplating process can be substituted or supplemented by a physical vapor deposition process. Finally, at operation 1706, the metallized and electroplated non-metal material is subjected to an electroless plating process once again. In many examples, the electroless plating process of operation 1706 is an electroless nickel process. The layer of nickel formed over the metallized and electroplated non-metal material, and the various edges and sidewalls thereof, provides corrosion resistance to the electroplated portions of the non-metal material.

Figure 18:
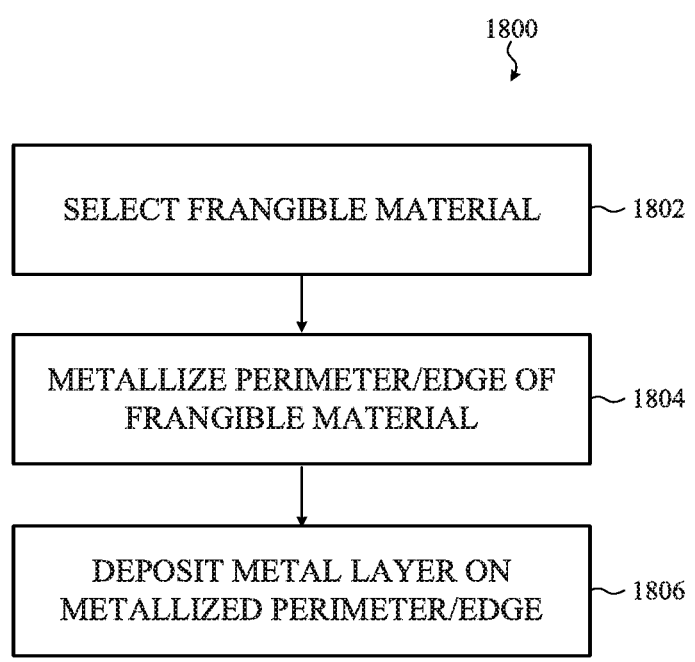
FIG. 18 depicts example operations of a method of forming a metal bumper around an edge of a frangible material.

FIG. 18 depicts a flow chart depicting example operations of a method of forming a metal bumper onto a frangible material. As with other methods described herein, the method of FIG. 18 can be performed in any suitable manner; the depicted operations are provided as a simplified example. Additional or fewer operations may be used. In some cases, portions of the method may be performed at different times.

The method 1800 begins at operation 1802 in which a frangible material is selected. The frangible material is typically strengthened glass, but any suitable frangible material can be selected including, but not limited to: glass, multi-layer glass, sapphire, ceramics, hardened metals, acrylic and so on.

At operation 1804, an edge, perimeter, or sidewall of the frangible material is metallized using one or more techniques such as described herein. In one example, and as noted with respect to other embodiments described herein, the edge, perimeter, or sidewall of the frangible material is roughened, coated with a primer that is subsequently activated, subjected to an electroless plating process (e.g., nickel or copper or another suitable electroless plating metal), and finally subjected to an electroplating process at operation 1806. In other cases, the electroplating process can be substituted or supplemented by a physical vapor deposition process. The electroplated or otherwise deposited metal is typically selected for one or more impact resistance properties such as, but not limited to: ductility, plastic or elastic deformation properties, corrosion resistance, and so on.

Figure 19:
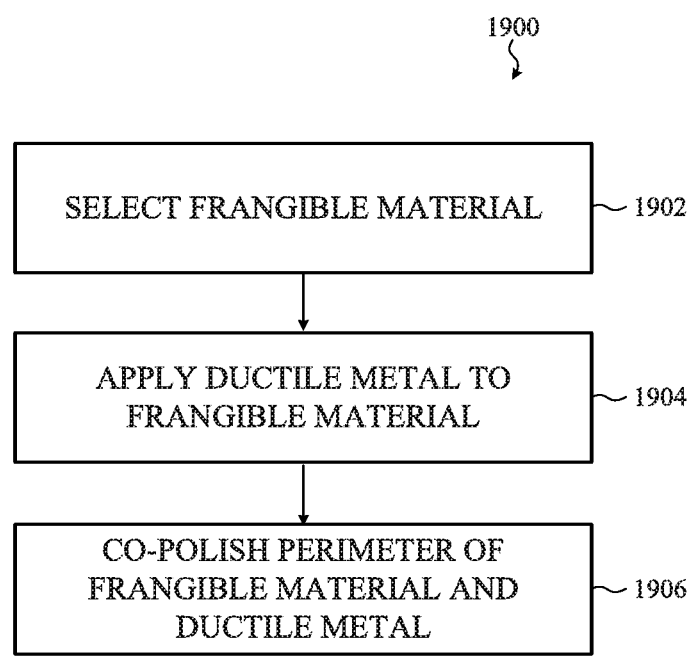
FIG. 19 depicts example operations of a method of co-polishing a metal material and a non-metal material.

FIG. 19 depicts a flow chart depicting example operations of a method of co-polishing a metal and a non-metal material. As with other methods described herein, the method of FIG. 19 can be performed in any suitable manner; the depicted operations are provided as a simplified example. Additional or fewer operations may be used. In some cases, portions of the method may be performed at different times.

The method 1900 begins at operation 1902 in which a frangible material such as glass is selected. At operation 1904, a ductile metal is applied to a portion of the frangible material. In some cases, the ductile metal can be applied on a face of the frangible material, whereas in others, the ductile metal can be applied to an edge or perimeter of the frangible material. The ductile metal can be applied using any suitable technique, including those described herein. Next at operation 1906, an interface between the frangible material and the ductile metal can be polished in a single operation (e.g., co-polished).

Figure 20:
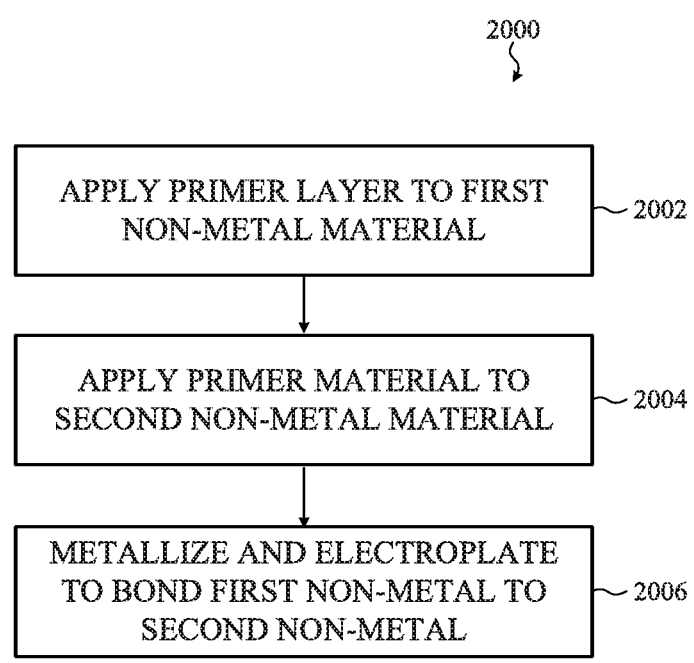
FIG. 20 depicts example operations of a method of bonding or joining two non-metal materials together.

FIG. 20 depicts a flow chart depicting example operations of a method of bonding or joining two non-metal materials together. As with other methods described herein, the method of FIG. 20 can be performed in any suitable manner; the depicted operations are provided as a simplified example. Additional or fewer operations may be used. In some cases, portions of the method may be performed at different times.

The method 2000 begins at operation 2002 in which a primer layer is applied to a first non-metal material. At operation 2004, a primer material can be applied to a second non-metal material. The first and second non-metal materials can be the same, or they may be different. Next, at operation 2006, the first and second non-metal materials are placed adjacent to one another, are metallized, and electroplated. In this example, the metallization layer and the electroplating layer atop the metallization layer extend across the interface between the first and second non-metal materials, thereby joining the two materials together.

It should be appreciated that the various embodiments described herein, as well as the functionality, operation, components, and capabilities thereof may be combined with other elements as necessary, and so any physical, functional, or operational discussion of an element or feature is not intended to be limited solely to that particular embodiment to the exclusion of others.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. An electronic device comprising:
    a display; and
    a housing defining an interior volume and at least partially surrounding the display, the housing comprising:
        an enclosure component formed from a glass material and defining a portion of an exterior surface of the housing;
        a primer layer disposed on a region of an inner surface of the enclosure component, the primer layer having an activated surface;
        an electroless metal layer formed on the activated surface of the primer layer; and
        an electroplated metal layer formed on the electroless metal layer.

2. The electronic device of claim 1, wherein:
    the electronic device further comprises a back cover assembly that includes the enclosure component;
    the enclosure component is a back glass cover that defines a back surface of the electronic device; and
    the electronic device further comprises a front cover assembly having a front cover that is positioned over the display.

3. The electronic device of claim 2, wherein:
    the front cover assembly defines a first portion of an exterior sidewall;
    the back cover assembly defines a second portion of the exterior sidewall; and
    the electronic device further comprises a frame component positioned between the front cover assembly and the back cover assembly and that defines a third portion of the exterior sidewall.

4. The electronic device of claim 3, wherein:
    the electroplated metal layer structurally couples the back cover assembly to the frame component.

5. The electronic device of claim 4, wherein the electroplated metal layer overlaps an inner sidewall of the frame component and a surface of the back cover assembly.

6. The electronic device of claim 1, wherein:
    the electroplated metal layer defines an electromagnetic coil; and
    the electromagnetic coil is operatively coupled to a circuit and configured to receive inductive power through the enclosure component.

7. The electronic device of claim 1, wherein:
    the activated surface comprises at least one of palladium, titanium, or nickel;
    the electroless metal layer comprises at least one of nickel or copper; and the electroplated metal layer comprises at least one of copper, silver, gold, palladium, titanium, or nickel.

8. The electronic device of claim 1, wherein:
the electroless metal layer is a first electroless metal layer;
the electronic device further comprises a second electroless metal layer formed over the first electroless metal layer and the electroplated metal layer; and
the second electroless metal layer comprises electroless nickel.

9. An electronic device comprising:
a display;
a battery operably coupled to the display; and
a housing at least partially surrounding the battery and the display and comprising:
  a back cover defining a portion of an external surface of the electronic device and comprising:
    a substrate formed from glass;
    a primer layer disposed along an inner surface of the substrate and comprising an activated region;
    an electroless metal layer formed on the activated region; and
    an electroplated metal layer formed on the electroless metal layer and defining a wireless charging coil that is configured to receive inductive power through the substrate, the wireless charging coil being operatively coupled to the battery.

10. The electronic device of claim 9, wherein:
the portion of the external surface of the electronic device is a first portion of the external surface of the electronic device; and
the electronic device further comprises a metal frame positioned around a perimeter of the back cover and defining a second portion of the external surface of the electronic device.

11. The electronic device of claim 9, wherein:
the electronic device further comprises a charging circuit that is operably coupled to the wireless charging coil; and
the charging circuit is configured to control inductive charging of the battery.

12. The electronic device of claim 9, wherein:
the activated region comprises at least one of palladium, titanium, or nickel;
the electroless metal layer comprises at least one of nickel or copper; and
the electroplated metal layer comprises at least one of copper, silver, gold, palladium, titanium, or nickel.

13. The electronic device of claim 9, wherein:
the primer layer disposed along a first region of the inner surface of the substrate is a first primer layer;
the activated region is a first activated region;
the electroless metal layer is a first electroless metal layer;
the electroplated metal layer is a first electroplated metal layer; and
the electronic device further comprises:
  a second primer layer disposed along a second region of the inner surface of the substrate and comprising a second activated region, the second primer layer and the second activated region at least partially surrounding the wireless charging coil;
  a second electroless metal layer formed on the second activated region; and
  a second electroplated metal layer formed on the second electroless metal layer.

14. The electronic device of claim 13, wherein the first electroplated metal layer is electrically isolated from the second electroplated metal layer.

15. The electronic device of claim 13, wherein:
the electronic device further comprises a metal frame positioned around a perimeter of the back cover; and
the second electroplated metal layer is electrically coupled to the metal frame.

16. An electronic device comprising:
a housing comprising;
  a glass component having an internal surface that is opposite to an external surface of the housing;
  a primer layer disposed over a portion of the internal surface of the glass component;
  a first electroless metal layer disposed over the primer layer;
  a first electroplated metal layer disposed over the first electroless metal layer;
  a first contact pad electrically connected to the first electroplated metal layer;
  an insulator layer disposed over the first electroplated metal layer;
  a second electroless metal layer disposed over the insulator layer;
  a second electroplated metal layer disposed over the second electroless metal layer and electrically isolated from the first electroplated metal layer by the insulator layer; and
  a second contact pad electrically connected to the second electroplated metal layer.

17. The electronic device of claim 16, wherein the first electroplated metal layer and the second electroplated metal layer are coupled to each other by electronic circuitry positioned within the housing.

18. The electronic device of claim 16, wherein the first electroplated metal layer and the second electroplated metal layer are coupled by one or more conductive vias that extend through the insulator layer.

19. The electronic device of claim 16, wherein at least one of the first electroplated metal layer or the second electroplated metal layer defines an antenna for a wireless communication system.

20. The electronic device of claim 16, wherein at least one of the first electroplated metal layer or the second electroplated metal layer forms an inductive coil of a wireless power transfer system of the electronic device.

* * * * *